United States Patent
Lee et al.

(10) Patent No.: US 11,789,482 B2
(45) Date of Patent: Oct. 17, 2023

(54) BANDGAP REFERENCE CIRCUIT INCLUDING RESISTIVITY TEMPERATURE COEFFICIENT CANCELLATION CIRCUIT, AND OSCILLATOR CIRCUIT INCLUDING THE BANDGAP REFERENCE CIRCUIT

(71) Applicant: SAMSUNG ELECTRONICS CO., LTD., Suwon-si (KR)

(72) Inventors: Jusung Lee, Seoul (KR); Wooseok Kim, Suwon-si (KR); Taeik Kim, Seongnam-si (KR); Chanyoung Jeong, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/702,482

(22) Filed: Mar. 23, 2022

(65) Prior Publication Data
US 2022/0311424 A1    Sep. 29, 2022

(30) Foreign Application Priority Data
Mar. 26, 2021  (KR) .................. 10-2021-0039841

(51) Int. Cl.
*G05F 3/30* (2006.01)
*H03K 3/011* (2006.01)
(Continued)

(52) U.S. Cl.
CPC ............. *G05F 3/30* (2013.01); *G05F 1/56* (2013.01); *H03K 3/011* (2013.01); *H03K 5/24* (2013.01)

(58) Field of Classification Search
CPC ....................................................... G05F 3/30
See application file for complete search history.

(56) References Cited

U.S. PATENT DOCUMENTS 7,420,359 B1    9/2008  Anderson et al.
7,636,010 B2   12/2009  Huang
(Continued)

FOREIGN PATENT DOCUMENTS

JP    2010-177612    8/2010
JP    6234008       11/2017
(Continued)

OTHER PUBLICATIONS

Junghyup Lee, et al. "A 10MHz 80 μW67 ppm/° C CMOS reference clock oscillator with a temperature compensated feedback loop in 0.18 μm CMOS", Published Jun. 16, 2009, Engineering, 2008 Symposium on VLSI Circuits.
(Continued)

*Primary Examiner* — Ryan Johnson
(74) *Attorney, Agent, or Firm* — F. Chau & Associates, LLC

(57) ABSTRACT

A bandgap reference circuit includes a reference current generation circuit configured to output a bandgap reference current insensitive to a temperature change, by using a first voltage inversely proportional to temperature and a third voltage proportional to temperature. The third voltage is a difference between the first voltage and a second voltage. The bandgap reference circuit further includes a resistivity temperature coefficient cancellation circuit configured to remove a first current proportional to temperature from the bandgap reference current by using the third voltage, and a reference voltage generation circuit configured to output a bandgap reference voltage insensitive to a temperature change by using a second current inversely proportional to temperature and a first resistance proportional to temperature. The second current is generated by removing the first current from the bandgap reference current.

15 Claims, 18 Drawing Sheets

(51) Int. Cl.
*H03K 5/24* (2006.01)
*G05F 1/56* (2006.01)

(56) References Cited

U.S. PATENT DOCUMENTS

| | | | |
|---|---|---|---|
| 8,436,687 B2 | 5/2013 | Aruga et al. | |
| 9,509,321 B2 | 11/2016 | Deval et al. | |
| 9,612,607 B2 | 4/2017 | Kumar et al. | |
| 10,228,715 B2 | 3/2019 | Segarra | |
| 10,284,206 B2 | 5/2019 | Itasaka | |
| 2006/0176042 A1* | 8/2006 | Lin | G05F 3/30 323/312 |
| 2008/0042737 A1* | 2/2008 | Kim | G05F 3/30 327/539 |
| 2009/0243713 A1* | 10/2009 | Marinca | G05F 3/30 327/542 |
| 2016/0091916 A1* | 3/2016 | Chang | G05F 3/262 323/268 |

FOREIGN PATENT DOCUMENTS

| | | |
|---|---|---|
| KR | 10-0816229 | 3/2008 |
| KR | 10-0986098 | 10/2010 |
| KR | 10-1885256 | 8/2018 |
| KR | 10-2007362 | 8/2019 |

OTHER PUBLICATIONS

Ying Cao, et al., "A 63,000 Q-Factor Relaxation Oscillator with Switched-Capacitor Integrated Error Feedback", ISSCC 2013, Session 10, Analog Techniques, 10.8.

* cited by examiner

BANDGAP REFERENCE CIRCUIT INCLUDING RESISTIVITY TEMPERATURE COEFFICIENT CANCELLATION CIRCUIT, AND OSCILLATOR CIRCUIT INCLUDING THE BANDGAP REFERENCE CIRCUIT

CROSS-REFERENCE TO RELATED APPLICATION

This U.S. non-provisional patent application claims priority under 35 U.S.C. § 119 to Korean Patent Application No. 10-2021-0039841, filed on Mar. 26, 2021, in the Korean Intellectual Property Office, the disclosure of which is incorporated by reference in its entirety herein.

1. TECHNICAL FIELD

The inventive concept relates to an oscillator circuit that generates a bandgap reference voltage and a bandgap reference current, and more particularly, to a bandgap reference circuit for cancelling a temperature coefficient of resistivity, and a temperature-compensated oscillator circuit including the bandgap reference circuit.

2. DISCUSSION OF RELATED ART

An oscillator is an electrical device that produces a periodic, oscillating electronic signal such as a sine or square wave. Oscillators are widely used in many electronics such as clock generators, calculators, and computers. For example, oscillators are commonly used to generate clock signals for regulating computers and electronic clocks.

A resistance-capacitor (RC) oscillator is an example of an oscillator that generates a clock signal. A temperature-compensated voltage or current, such as a voltage or current generated by a bandgap reference (BGR) circuit, is used to reduce frequency fluctuations caused by temperature changes.

A frequency output by the RC oscillator is affected by a temperature coefficient of resistivity. An ideal period of the clock signal generated by the RC oscillator is determined by multiplying R times C, where R refers to a resistance value and C refers to a capacitor value. However, since the period is affected by a temperature depending on a temperature coefficient of resistivity, the actual period T is determined by $T=R\_0*(1+t*TC)*C$, where R_0 refers to a resistance value at absolute temperature 0K, t refers to an absolute temperature value, and TC refers to the temperature coefficient of resistivity.

Thus, a method for cancelling an affect of the temperature coefficient of resistivity is needed to output an accurate and constant frequency regardless of the temperature.

SUMMARY

At least one embodiment of the inventive concept provides a bandgap reference circuit that simultaneously generates a temperature-insensitive reference voltage and a temperature-insensitive reference current by using a resistivity temperature coefficient cancellation circuit, and a temperature-compensated oscillator circuit including the bandgap reference circuit. In addition, at least one embodiment of the inventive concept provides a method of trimming a duty ratio by using a single switch to trim resistors and capacitors that change according to a process.

According to an embodiment of the inventive concept, there is provided a bandgap reference circuit including a reference current generation circuit, a resistivity temperature coefficient cancellation circuit, and a reference voltage generation circuit. The reference current generation circuit is configured to output a bandgap reference current insensitive to a temperature change by using a first voltage inversely proportional to temperature and a third voltage proportional to temperature. The third voltage is a difference between the first voltage and a second voltage. The resistivity temperature coefficient cancellation circuit is configured to remove a first current proportional to temperature from the bandgap reference current by using the third voltage. The reference voltage generation circuit is configured to output a bandgap reference voltage insensitive to a temperature change by using a second current inversely proportional to temperature and a first resistance proportional to temperature, the second current being generated by removing the first current from the bandgap reference current.

According to an embodiment of the inventive concept, there is provided a bandgap reference circuit including a reference current generator, a resistivity temperature coefficient cancellation circuit, and a reference voltage generator. The reference current generator includes first and second bipolar junction transistors (BJTs) and first and second operational amplifiers. The reference current generator is configured to generate a reference current insensitive to a temperature change by using a difference between a base-emitter voltage of the first BJT and a base-emitter voltage of the second BJT. The resistivity temperature coefficient cancellation circuit includes a first Proportional To Absolute Temperature (PTAT) resistor and a third operational amplifier. The resistivity temperature coefficient cancellation circuit is configured to remove a PTAT current from the reference current. The reference voltage generator includes a second PTAT resistor through which a Complementary To Absolute Temperature (CTAT) current generated by removing the PTAT current from the reference current flows. The reference voltage generator is configured to output a voltage of the second PTAT resistor as a reference voltage. The base-emitter voltages of the first and second BJTs are respectively applied to both ends of the first PTAT resistor by using the second and third operational amplifiers, and the PTAT current flows through the first PTAT resistor.

According to an embodiment of the inventive concept, there is provided an oscillator circuit including a bandgap reference circuit, a clock generator, and a multi-phase digitally controlled oscillator. The bandgap reference circuit is configured to generate a reference current source and a reference voltage source that cancels a temperature coefficient of resistivity. The clock generator is configured to generate a first clock signal and a sampling signal. The clock generator includes a digital duty trimmer circuit configured to adjust a duty ratio of the first clock signal according to first and second digital input codes and generate a second clock signal for charging a first capacitor connected in series with the reference current source. The multi-phase digitally controlled oscillator is configured to generate a plurality of multi-phase oscillation signals each having an output frequency, based on the duty ratio.

BRIEF DESCRIPTION OF THE DRAWINGS

Embodiments of the inventive concept will be more clearly understood from the following detailed description taken in conjunction with the accompanying drawings in which.

DETAILED DESCRIPTION OF THE EMBODIMENTS

Hereinafter, embodiments of the inventive concept will be described in detail with reference to the accompanying drawings.

Figure 1A:
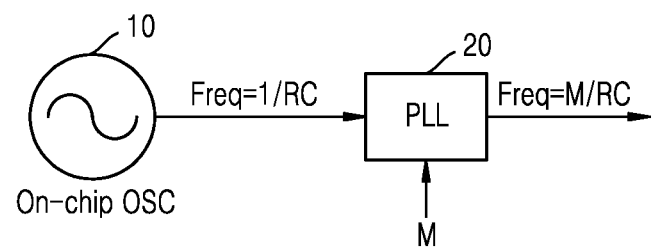
FIG. 1A is a block diagram of a frequency synthesis oscillator circuit according to a comparative example.
Figure 1B:
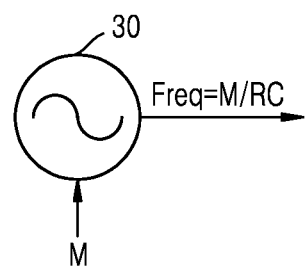
FIG. 1B is a block diagram of a frequency synthesis oscillator circuit implemented as one on-chip oscillator, according to an example embodiment.

FIG. 1A is a block diagram of a frequency synthesis oscillator circuit according to a comparative example, and FIG. 1B is a block diagram of a frequency synthesis oscillator circuit implemented as one on-chip oscillator, according to an example embodiment.

Referring to FIG. 1A, the frequency synthesis oscillator circuit according to the comparative example includes an on-chip oscillator 10, which outputs a signal having a relatively low frequency (F=1/(R*C)) as a reference clock frequency, and a phase-locked loop (PLL) 20. The PLL 20 is cascaded to the on-chip oscillator 10, to multiply a frequency of the signal. The PLL 200 is configured to output a signal having a relatively high frequency (F=M/(R*C)), when an external crystal oscillator is not used. The frequency synthesis oscillator circuit may provide a stable high-frequency signal source by stabilizing a frequency using a phase-locked loop at a relatively low frequency and accurately multiplying the frequency of the signal by M times. A frequency synthesis oscillator may be defined as a variable oscillator that synthesizes a desired frequency by multiplying, dividing, and mixing an oscillation frequency of an oscillator with high accuracy and stability and obtains a desired frequency by oscillating a certain stable frequency based on the synthesized frequency. The on-chip oscillator 10 may be defined as an oscillator capable of generating a signal having a certain reference frequency to be used in a radio frequency (RF) system, and may be, for example, an RC oscillator. The PLL 20 may be defined as a frequency negative feedback circuit configured such that the output signal thereof always maintains a constant frequency, and is mainly used for frequency stabilization in a low frequency band.

FIG. 1B illustrates a frequency synthesis oscillator according to an embodiment, in which an on-chip oscillator 30 itself may perform frequency synthesis such that a reference frequency F has an M/RC value. The on-chip oscillator 30 includes a bandgap reference circuit including a resistivity temperature coefficient cancellation circuit to be described below, and a digital duty trimmer circuit for trimming an oscillation signal by adjusting the duty ratio of a charging clock signal. The on-chip oscillator 30 may generate a desired frequency more accurately than the frequency synthesis oscillator circuit of FIG. 1A.

Figure 2:
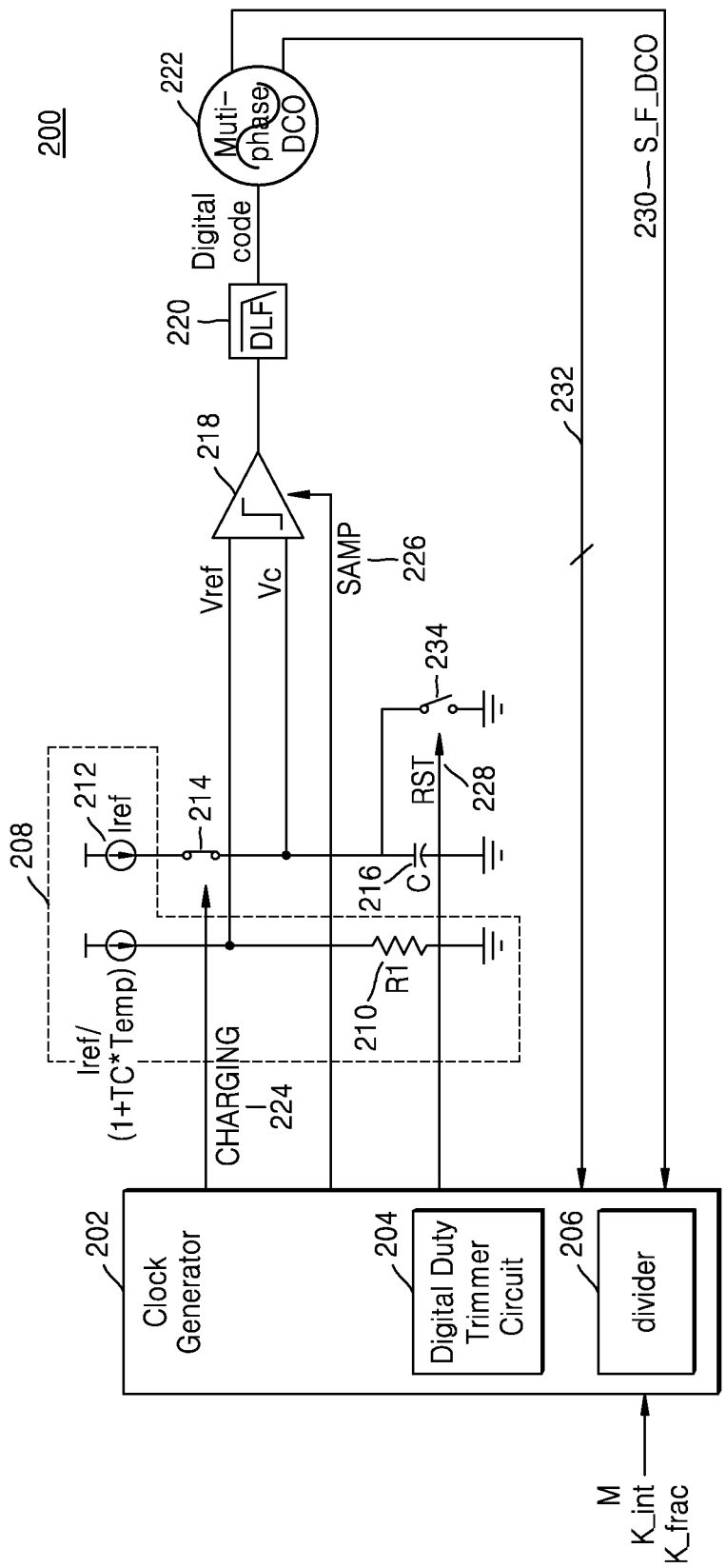
FIG. 2 is a block diagram illustrating a configuration of the frequency synthesis oscillator circuit of FIG. 1B.

FIG. 2 is a block diagram illustrating a configuration of the frequency synthesis oscillator circuit of FIG. 1B according to an exemplary embodiment.

Referring to FIG. 2, a frequency synthesis oscillator circuit 200 according to an embodiment includes a band gap reference circuit 208, a clock generator 202 including a digital duty trimmer circuit 204 (e.g., trimmer circuit) and a divider 206 (e.g., divider circuit), a comparator 218, a digital loop filter (DLF) 220, and a multi-phase digitally controlled oscillator (DCO) 222.

According to an embodiment, the multi-phase DCO 222 outputs an oscillation signal S_F_DCO having a frequency F_DCO to the clock generator 202, according to an initially set digital code. The multi-phase DCO 222, which outputs a multi-phase oscillation signal, outputs an oscillation signal S_F_DCO (i.e., a signal 230) having a frequency F_DCO of phase 0 corresponding to a main phase, and also outputs an oscillation signal 232 having a frequency F_DCO of phase 1 to phase 7 corresponding to phases other than the main phase. Among multi-phase oscillation signals, oscillation signals other than a main phase oscillation signal, for example, the oscillation signal 232 having the frequency F_DCO of phase 1 to phase 7 may be referred to as 'sub-phase oscillation signals'. A detailed description thereof will be described later with reference to FIG. 7.

For example, the divider 206 included in the clock generator 202 may receive an oscillation signal having a frequency F_DCO, may divide the frequency F_DCO so that the frequency is F_DCO/(2*M) by counting a rising edge M times during a half period of the oscillation signal and counting a falling edge M times during the other half period of the oscillation signal, and may generate a clock signal 224 having a divided frequency. In an embodiment, the duty ratio of the generated clock signal becomes 50:50. The duty ratio may be defined as a ratio of a time (e.g., a charging period) from a rising edge of a clock signal to a falling edge of the clock signal following the rising edge to a time (e.g., a discharging period) from the falling edge to a rising edge following the falling edge, or may be defined as the percentage of time a signal is active during the total duration of the signal. In the present disclosure, the duty ratio may be defined as a ratio occupied by a time a capacitor 216 is charged in one cycle of a clock signal.

In an embodiment, a switch 214 is turned on during a half period T_h defined as a time duration from a rising edge to a falling edge following the rising edge. A clock signal having a frequency F_DCO/(2*M) may be used as a clock signal for charging the capacitor 216 with a bandgap reference current Iref 212. One period may be defined as a time duration from a rising edge (or falling edge) to a next rising edge (or falling edge). The divider 206 may include a counter (not shown), and may be defined as a circuit that divides the frequency of an oscillation signal output from the multi-phase DCO 222 by an appropriate division ratio to obtain a relatively low frequency.

According to an embodiment, the clock generator 202 generates a clock signal CHARGING (i.e., a signal 224) for charging the capacitor 216, a sampling signal SAMP (i.e., a signal 226) for comparing a band gap reference voltage Vref with a voltage Vc of the capacitor 216, and a reset signal RST (i.e., a signal 228) for discharging the capacitor 216 after sampling.

The bandgap reference circuit 208 may be defined as a circuit for supplying a reference voltage and/or a reference current of a constant level, which is not affected by fluctuations in power supply voltage, temperature changes, and process variations due to output characteristics in which a negative (−) temperature coefficient and a positive (+) temperature coefficient cancel each other. The bandgap reference circuit 208 shown in FIG. 2 is a conceptual diagram schematically illustrating an internal operation.

The bandgap reference circuit 208 according to an embodiment generates a bandgap reference current Iref. A bandgap reference voltage Vref corresponding to the voltage of a first resistor R1 210 may be generated using the generated bandgap reference current Iref and a resistivity temperature coefficient cancellation circuit 410 (see FIG. 4) to be described below. The bandgap reference voltage Vref may be expressed by Equation (1) as follows.

$$V_{ref} = \frac{I_{ref}}{(1 + TC*t)} \times R_1 \text{ when } R_1 = R_0(1 + TC \times t) \tag{1}$$

In Equation (1), TC denotes a temperature coefficient of resistivity, and t denotes an absolute temperature value. In addition, Ro denotes a resistance value at absolute temperature 0 K.

The bandgap reference voltage Vref corresponds to a reference voltage supplied by the bandgap reference circuit 208, and the bandgap reference current Iref corresponds to a reference current supplied by the bandgap reference circuit 208.

In an embodiment, the bandgap reference circuit 208 receives a clock signal having a frequency F_DCO/(2*M), generated by the clock generator 202, and generates the bandgap reference voltage Vref by using the clock signal.

In an embodiment, the comparator 218 compares the bandgap reference voltage Vref with the voltage Vc of the capacitor 216 to output a comparison result as a signal. The DLF 220 may generate a digital code for controlling the frequency of the multi-phase DCO 222 by low-pass filtering a signal corresponding to the comparison result. The generated digital code may be transmitted to the multi-phase DCO 222, and an oscillation signal having a frequency changed according to the generated digital code may be output to the clock generator 202.

The above-described processes may be repeated until the bandgap reference voltage Vref and the voltage Vc of the capacitor 216 have the same value, and the bandgap reference voltage Vref and the voltage Vc of the capacitor 216 may be locked when the bandgap reference voltage Vref and the voltage Vc of the capacitor 216 have the same value. Accordingly, a final output frequency Fout may be determined to correspond to a finally generated digital code, and the final output frequency Fout of the multi-phase DCO 222 may be expressed by Equation (2) below.

$$F_{out} = \frac{M}{T\_h} = \frac{M \times I_{ref}}{C \times V_{ref}} \tag{2}$$

According to Equation (2), the final output frequency Fout may be determined by the bandgap reference current Iref, the bandgap reference voltage Vref, and the capacitor 216, and the frequency synthesis oscillator circuit 200 may multiply the frequency by a desired frequency band by adjusting M and generate a final oscillation signal.

Figure 3:
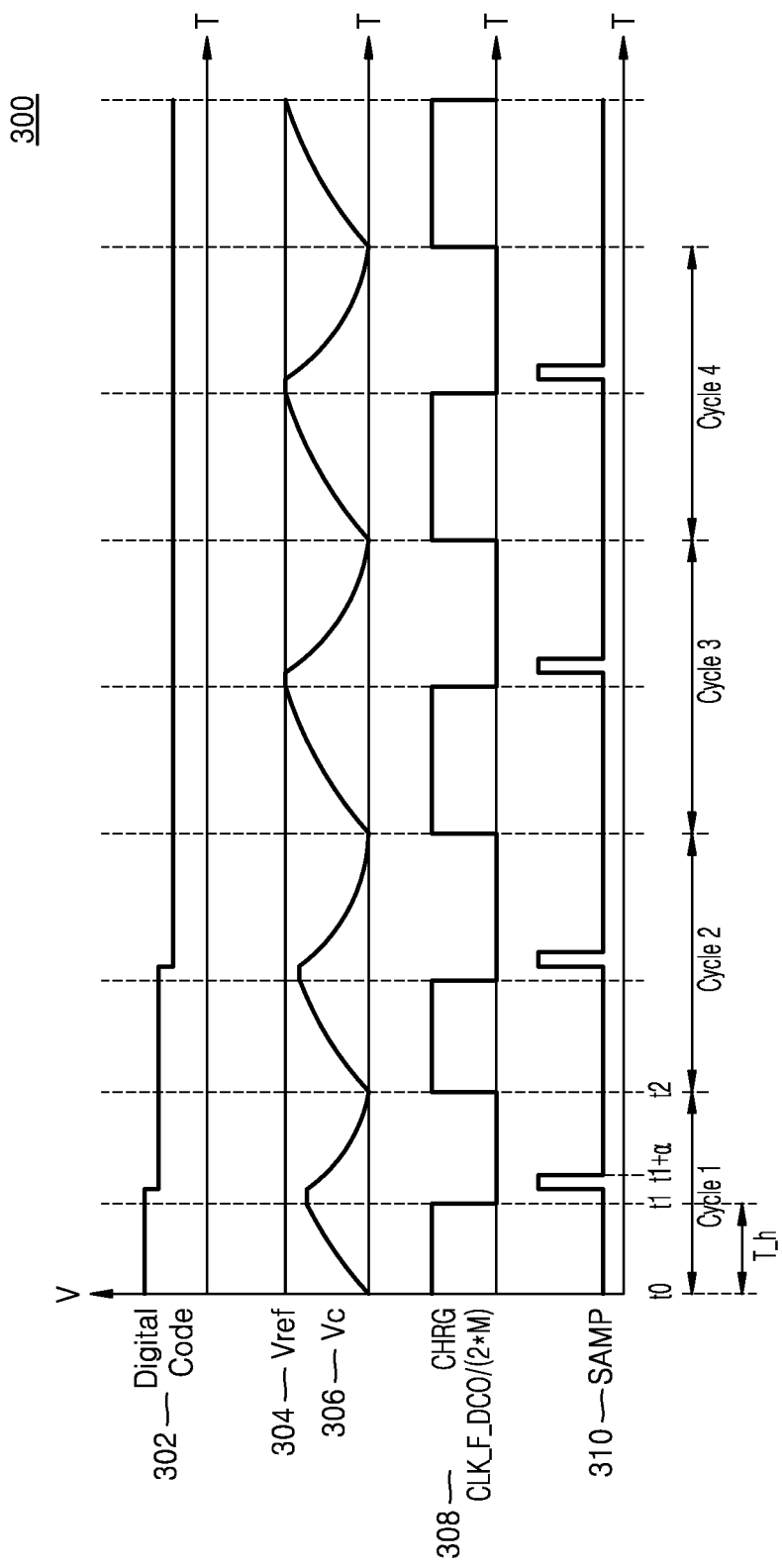
FIG. 3 is a timing diagram illustrating internal signals of the frequency synthesis oscillator circuit of FIG. 2, according to an embodiment.

FIG. 3 is a timing diagram 300 illustrating internal signals of the frequency synthesis oscillator circuit of FIG. 2, according to an embodiment.

In the timing diagram 300 of FIG. 3, it is assumed that the clock generator 202 generates and outputs a clock signal having a duty ratio of 50:50 and a frequency of F_DCO/(2*M). Hereinafter, it will be described with further reference to FIG. 2 for better understanding.

Referring to Cycle 1 of FIG. 3, a waveform 302 of a digital code during a half period of Cycle 1 represents the voltage level of an initially set digital code applied to the multi-phase DCO 222. The initially set digital code may be generated by the DLF 220. According to an embodiment, the voltage level of the digital code is related to the frequency of an oscillation signal output from the multi-phase DCO 222, and when the voltage level of the digital code decreases, the frequency of the oscillation signal output from the multi-phase DCO 222 may decrease. For example, when a voltage level represented by the digital code decreases, the frequency of the oscillation signal output from the multi-phase DCO 222 may decrease.

A waveform 304 of a bandgap reference voltage Vref signal in Cycle 1 represents the level of a constant bandgap reference voltage generated by the bandgap reference circuit 208.

A waveform 306 of a voltage Vc signal of the capacitor 216 in Cycle 1 represents the voltage Vc of the capacitor 216 charged from the bandgap reference current Iref generated by the bandgap reference circuit 208.

Referring to a waveform 308 of a clock signal CLK_F_DCO/(2*M) having a frequency F_DCO/(2*M) in Cycle 1, a time duration from a first rising edge of the clock signal CLK_F_DCO/(2*M) having the frequency F_DCO/(2*M) to a falling edge following the rising edge may be defined as a half period T_h. The clock signal CLK_F_DCO/(2*M) having the frequency F_DCO/(2*M) may be used as a signal for turning on/off the first switch 214 for charging the capacitor 216. Referring to FIG. 2 and the waveform 306 of the voltage Vc signal of the capacitor 216 in Cycle 1, when the switch 214 is turned on at time T=t0, the capacitor 216 may be charged for the half period T_h, and thus, the voltage Vc of the capacitor 216 may increase. During the other half period of Cycle 1, a logic circuit may operate. For example, the switch 214 may be configured by a transistor such as an N-type MOSFET (NMOS) transistor. For example, the clock signal CLK_F_DCO/(2*M) having the frequency F_DCO/(2*M) may be provide to a gate of the transistor. The logic circuit may be defined as a circuit that uses, as a clock signal, a final oscillation signal output from the frequency synthesis oscillator circuit 200 according to an embodiment or operates in synchronization with a clock signal generated from the final oscillation signal.

According to an embodiment, the voltage Vc of the capacitor 216 has a smaller value than the bandgap reference voltage Vref at time T=t1 after the half period T_h has elapsed. At time T=t1, when a clock signal CHRG for charging the capacitor 216 is at a falling edge and thus the switch 214 is turned off, no current flows and charges of the capacitor 216 may be held. The digital code may be updated by the DLF 220 at a falling edge of a sampling signal SAMP, and at time T=t1+α, the capacitor 216 may be discharged during the remaining half period by using the second switch 234 according to a reset signal RST (not shown). For example, the second switch 234 may be implemented by a transistor whose gate receives the reset signal RST.

Referring to a waveform 310 of the sampling signal SAMP, sampling may be performed at a rising edge of the sampling signal SAMP to compare the bandgap reference voltage Vref with the voltage Vc of the capacitor 216 for a certain time duration at a certain time after the charging of the capacitor 216 is held in Cycle 1. Accordingly, the comparator 218 may output a sampling result value (0 or 1). Also, the digital code may be updated by the digital loop filter 220 at the falling edge of the sampling signal SAMP. The sampling signal SAMP having the waveform 310 of FIG. 3 is merely an example, and embodiments of the inventive concept are not limited thereto.

According to an embodiment, because, in Cycle 1, the voltage Vc of the capacitor 216 has a smaller value than the bandgap reference voltage Vref, it means that a clock signal having a higher frequency than a target frequency in the frequency synthesis oscillator circuit 200 is output at time T=t1 and the voltage level of the digital code needs to be lowered to generate an oscillation signal having the target frequency. Accordingly, in Cycle 1, the digital code after sampling may be set to a value lower than the level of the digital code during the half cycle T_h.

The above-described processes may be repeated until the bandgap reference voltage Vref and the voltage Vc of the capacitor 216 have the same value. According to an embodiment, the above-described processes may be repeated in Cycle 2 and Cycle 3, and if it is determined that the bandgap reference voltage Vref is equal to the voltage Vc of the capacitor 216, as a sampling result of Cycle 3, the frequency of an output oscillation signal of the multi-phase DCO 222 may be locked to the final output frequency that is the target frequency.

Figure 4:
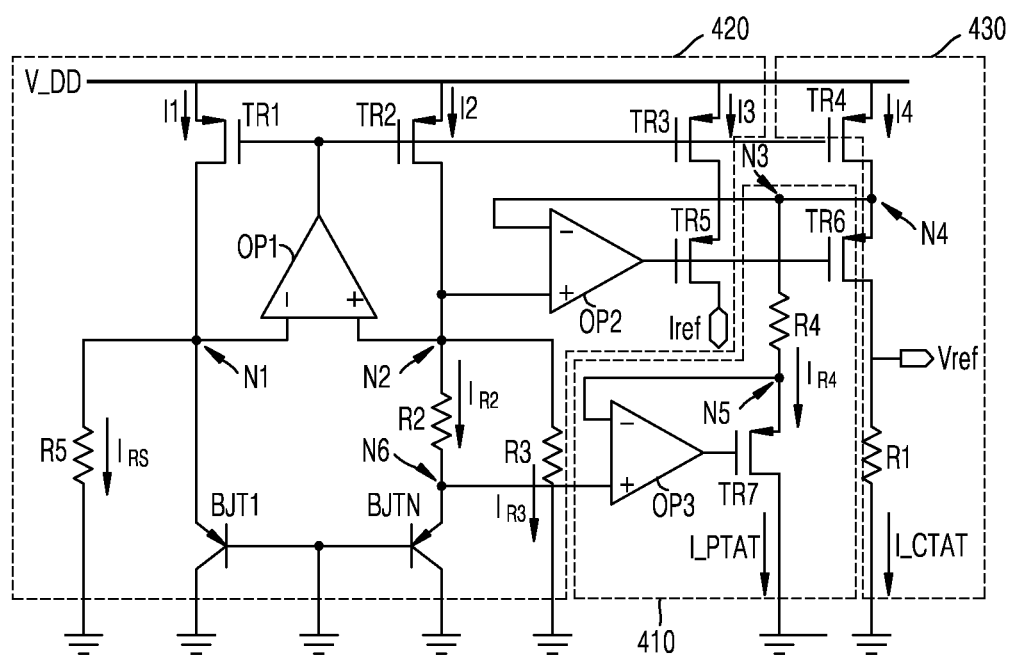
FIG. 4 is a block diagram of a bandgap reference circuit including a resistivity temperature coefficient cancellation circuit according to an embodiment.

FIG. 4 is a block diagram of a bandgap reference circuit including a resistivity temperature coefficient cancellation circuit according to an embodiment.

FIG. 4 specifically illustrates an implementation example of the bandgap reference circuit 208 included in the frequency synthesis oscillator circuit 200 of FIG. 2.

Unlike previous RC oscillator that uses a reference resistor insensitive to temperature such as a Proportional To Absolute Temperature (PTAT) resistor and a Complementary To Absolute Temperature (CTAT) resistor, the bandgap reference circuit 400 according to an embodiment of the inventive concept uses a method for cancelling a temperature coefficient (TC) of a PTAT/CTAT resistor to generate a bandgap reference voltage Vref and a bandgap reference current Iref independent of temperature change. PTAT means a property that a resistance value of a resistor increases in proportion to temperature, and CTAT means a property that a resistance value of a resistor decreases in proportion to temperature. It is assumed that first to fifth resistors R1 to R5 included in the bandgap reference circuit 400 according to an embodiment are PTAT resistors having PTAT characteristics.

According to an embodiment, the bandgap reference circuit 400 includes a reference current generation circuit 420 including first and second NMOS transistors TR1 and TR2, a first operational amplifier OP1, a second resistor R2, a third resistor R3, a first bipolar junction transistor BJT1, and an N bipolar junction transistor BJTN. The N bipolar junction transistor BJTN may be referred to as a second bipolar junction transistor.

The first NMOS transistor TR1 may be connected in series between a first power supply voltage V_DD and a first node N10, and the second NMOS transistor TR2 may be connected in series between the first power supply voltage V_DD and a second node N2. The first NMOS transistor TR1 and the second NMOS transistor TR2 supply current to the first bipolar junction transistor BJT1 and the N bipolar junction transistor BJTN, respectively. The first NMOS transistor TR1 and the second NMOS transistor TR2 may be transistors having the same size. In this case, the fact that one transistor has the same size as the other transistor means that the size of the ratio (W/L) of the width to the length of a channel region is the same between the two transistors. Accordingly, when two transistors having the same size have the same voltages applied to the gate, source, and drain terminals thereof, the same current may flow through the two transistors. The first operational amplifier OP1 may receive the voltage levels of the first node N1 and the second node N2 as input signals. The output terminal of the first operational amplifier OP1 may be connected to a node between the gate terminal of the first NMOS transistor TR1 and the gate terminal of the second NMOS transistor TR2. The first bipolar junction transistor BJT1 may be connected in series between the first node N1 and a ground voltage. The N bipolar junction transistor BJTN may be configured by connecting N bipolar junction transistors in parallel, or may have a size that is N (N is a real number that is greater than 1) times the size of the first bipolar junction transistor BJT1. The N bipolar junction transistor BJTN may be connected in series between the second node N2 and the ground voltage. In an embodiment, the first power supply voltage V_DD is higher than the ground voltage.

When a voltage between the base terminal of the first bipolar junction transistor BJT1 and the emitter terminal thereof is expressed as $V_{BE1}$ (e.g., a second voltage), a voltage between the base terminal of the N bipolar junction transistor BJTN and the emitter terminal thereof is expressed as $V_{BEN}$, and a voltage between the second node N2 and the emitter terminal of the N bipolar junction transistor BJTN is expressed as $\Delta V_{BB}$. The voltage $\Delta V_{BB}$ (e.g., a first voltage) may be expressed by Equation (3) below.

$$\Delta V_{EE} = V_{BE1} - V_{BBN} \qquad (3)$$

In an embodiment, $V_{BE1}$ (e.g., a third voltage) is a CTAT voltage that decreases in proportion to temperature, and $\Delta V_{EE}$ is a PTAT voltage that increases in proportion to temperature. In an embodiment, the base terminal of the first bipolar junction transistor BJT1 and the base terminal of the N bipolar junction transistor BJTN are connected to the same node and are connected to the ground voltage.

Accordingly, a current $I_{R2}$ flowing through the second resistor R2 may be determined according to the magnitude of $\Delta V\_BE$, and corresponds to a PTAT current having a property of increasing in proportion to temperature. The current $I_{R2}$ flowing through the second resistor R2 may be expressed by Equation (4) below.

$$I_{R2} = \frac{\Delta V_{BE}}{R_2} \qquad (4)$$

In an embodiment, it is assumed that the voltage level of the first node N1 is equal to that of the second node N2, and each of a current $I_{R5}$ flowing through the fifth resistor R5 and a current $I_{R3}$ flowing through the third resistor R3 correspond to a CTAT current having the property of decreasing in proportion to temperature. The current $I_{R5}$ flowing through the fifth resistor R5 and the current $I_{R3}$ flowing through the third resistor R3 may be expressed by Equation (5) and Equation (6), respectively.

$$I_{R5} = \frac{V_{BE1}}{R_5} \qquad (5)$$

$$I_{R3} = \frac{V_{BE1}}{R_3} \qquad (6)$$

Referring to FIG. 4, the band gap reference circuit 400 includes a current mirror including the first NMOS transistor TR1, the second NMOS transistor TR2, a third NMOS transistor TR3, and a fourth NMOS transistor TR4. The gate terminals of the first to fourth NMOS transistors TR1, TR2, TR3, and TR4 are connected to the same node. Accordingly, Equation (7) below is established.

$$I_1 = I_2 = I_3 = I_4 \qquad (7)$$

In addition, a current $I_2$ flowing from the source terminal of the second NMOS transistor TR2 to the drain terminal thereof according to Kirchhoff's current law may be expressed by Equation (8) below.

$$I_2 = I_{R2} + I_{R2} = \frac{\Delta V_{BE}}{R_2} + \frac{V_{BE1}}{R_1} \qquad (8)$$

The second operational amplifier OP2 may receive the voltage levels of the second node N2 and a fourth node N4 as inputs. An output terminal of the second operational amplifier OP2 may be connected to the gate terminal of the fifth transistor TR5. The second operational amplifier OP2 may output a stable voltage level in preparation for a case in which the bandgap reference circuit 400 is in a power-down state.

For example, the third NMOS transistor TR3 and the fifth NMOS transistor TR5 may be connected between the first power supply voltage V_DD and the capacitor 216 (see FIG. 2) connected outside the bandgap reference circuit 400, and may generate a bandgap reference current Iref that is insensitive to temperature changes. The band gap reference current Iref may be expressed by Equation (9) below.

$$I_{ref} = \frac{\Delta V_{BE}}{R_2} + \frac{V_{BE1}}{R_1} = \frac{\alpha \Delta V_{BE} + \beta V_{BE1}}{R_0(1 + TC \cdot t)} \qquad (9)$$

In Equation (9), TC denotes a temperature coefficient of resistivity, and t denotes an absolute temperature value. In addition, Ro denotes a resistance value at an absolute temperature of 0 K, and constants α and β denote constants constituting the resistance values of the second and third resistors R2 and R3, respectively. Because $\Delta V_{BE}$ (e.g., a third voltage proportional to temperature) is a PTAT voltage and $V_{BE1}$ (e.g., a first voltage inversely proportional to temperature) is a CTAT voltage, a bandgap reference current Iref that is constant with temperature may be generated by adjusting the constants α and β (i.e., by adjusting the resistance values of the resistors R2 and R3). For example, the current Iref may be insensitive to temperature change.

In an embodiment, the bandgap reference circuit 400 further includes a resistivity temperature coefficient cancellation circuit 410. According to an embodiment, since the resistivity temperature coefficient cancellation circuit 410 is included in the bandgap reference circuit 400, the bandgap reference circuit 400 may generate the bandgap reference current Iref and simultaneously generate the bandgap reference voltage Vref independent of the temperature change.

In an embodiment, the resistivity temperature coefficient cancellation circuit 410 includes the fourth resistor R4, a seventh transistor TR7, and a third operational amplifier OP3. The resistivity temperature coefficient cancellation circuit 410 may be connected to the fourth node N4 of the band gap reference circuit 400. Accordingly, a PTAT current I_PTAT may be cancelled from the bandgap reference current Iref flowing from the source terminal to the drain terminal of the fourth NMOS transistor TR4, and thus, a CTAT current may flow through the fifth resistor R5 corresponding to a PTAT resistor.

The fourth resistor R4 may be connected in series between a third node N3 and a fifth node N5, and the seventh NMOS transistor TR7 may be connected in series between the fifth node N5 and the ground voltage. The third operational amplifier OP3 may receive the voltage of the fifth node N5 and the voltage of the emitter terminal of the N bipolar junction transistor BJTN as input signals. An output terminal of the third operational amplifier OP3 may be connected to the gate terminal of the seventh transistor TR7. The third operational amplifier OP3 may output a stable voltage level in preparation for a case in which the bandgap reference circuit 400 is in a power-down state.

According to the circuit configuration of an embodiment, the voltage of the third node N3 corresponds to $V_{BE1}$ (e.g., a first voltage), and the voltage of the fifth node NS corresponds to $V_{BEN}$ (e.g., a second voltage). Accordingly, the voltage of the fourth resistor R4 is $\Delta V_{BE}$ (e.g., a third voltage) corresponding to a PTAT voltage, and a current $I_{R4}$ flowing through the fourth resistor R4 may be expressed by Equation (10) below.

$$I_{R4} = \frac{\Delta V_{BE}}{R_4} = : \text{I\_PTAT} \qquad (10)$$

Because the current $I_{R4}$ flowing through the fourth resistor R4 corresponds to a PTAT current having a property of increasing in proportion to temperature, the current $I_{R4}$ may be referred to as a temperature proportional current I_PTAT (e.g., first current).

In an embodiment, the bandgap reference circuit 400 further includes a reference voltage generation circuit 430 including a fourth NMOS transistor TR4, a sixth NMOS transistor TR6, and a first resistor R1.

The fourth NMOS transistor TR4 may be connected in series between the first power supply voltage V_DD and the fourth node N4. The sixth NMOS transistor TR6 may be connected in series with the fourth NMOS transistor TR4, and the drain terminal of the fourth NMOS transistor TR4 may be connected to the source terminal of the sixth NMOS transistor TR6.

The voltage of the first resistor R1, that is, the bandgap reference voltage Vref, may be expressed by Equations (11) and (12).

$$V_{ref} = (I_{ref} - \text{I\_PTAT}) * R_1 = : \frac{(\alpha - \gamma)\Delta V_{BE} + \beta V_{BE1}}{R_0(1 + TC*t)} * \zeta R_0(1 + TC*t) \quad (11)$$

$$I_{ref} - I_{PTAT} = I_{R1} = : \text{I\_CTAT} \quad (12)$$

Since the resistivity temperature coefficient cancellation circuit 410 is connected to the third node N3, the bandgap reference current Iref flowing from the source terminal to the drain terminal of the fourth NMOS transistor TR4 may be divided into a PTAT current I_PTAT and a CTAT current I_CTAT. As a result, the CTAT current I_CTAT flows through the first resistor R1. The current (e.g., a second current) flowing through the first resistor R1 may be referred to as a current inversely proportional to temperature.

Referring to Equation (11), TC denotes a temperature coefficient of resistivity, and t denotes an absolute temperature value. In addition, Ro denotes a resistance value at an absolute temperature of 0 K, and a constant γ and a constant ζ denote a constant constituting the resistance value of the fourth resistor R4 and a constant constituting the resistance value of the first resistor R1, respectively. Because the current flowing through the first resistor R1 is a CTAT current and the first resistor R1 is a PTAT resistor, a bandgap reference current Iref that is constant with temperature may be generated by adjusting the constant γ and the constant ζ (i.e., by adjusting the resistance values of the resistor R4 and the resistor R1). The resistance of first resistor R1 may be a first resistance proportional to temperature.

Figure 5A:
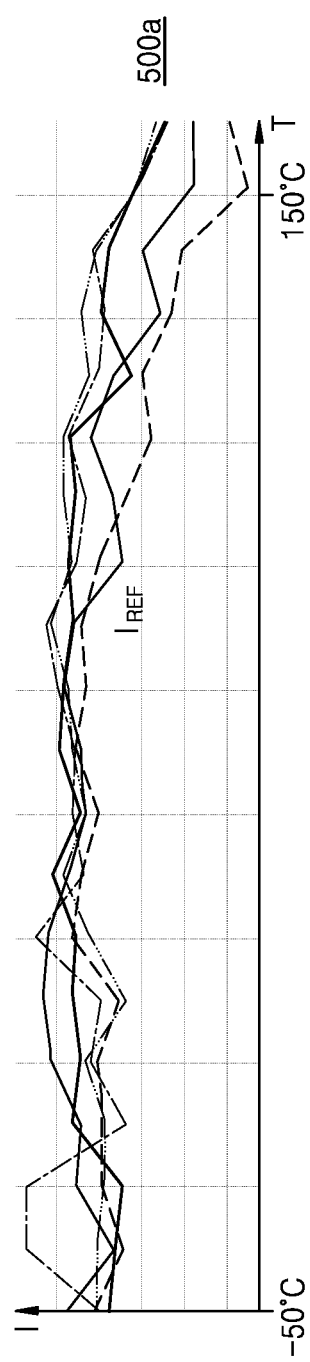
FIGS. 5A to 5C are graphs showing results of simulating a bandgap reference circuit according to an embodiment.
Figure 5B:
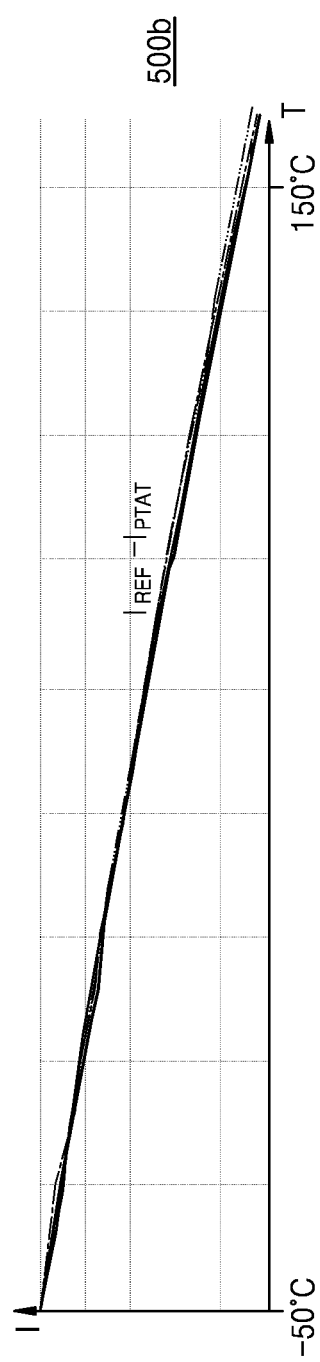
Figure 5C:
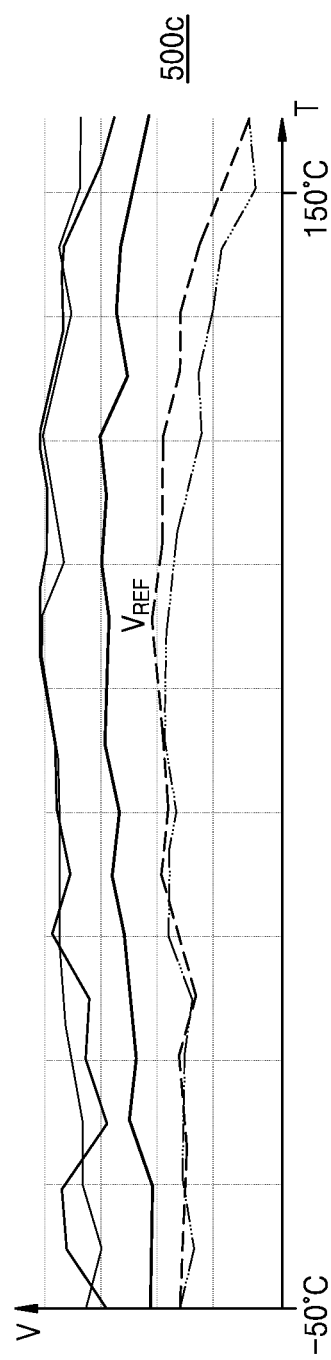

FIGS. 5A to 5C are graphs showing results of simulating a bandgap reference circuit according to an embodiment.

FIG. 5A is a simulation result graph showing a value of a bandgap reference current $I_{REF}$ generated by the bandgap reference circuit 400 of FIG. 4 according to a temperature value within a temperature range of about −50° C. to about 150° C.

Referring to FIG. 5A, graphs according to various embodiments, which show a bandgap reference current $I_{REF}$ according to temperature change, are illustrated by varying the constant α and the constant β (that is, by varying the sizes of the resistors R2 and R3). Accordingly, it may be seen that the value of the bandgap reference current $I_{REF}$ within the temperature range of about −50° C. to about 150° C. is maintained relatively constant.

FIG. 5B is a simulation result graph showing a difference between the bandgap reference current $I_{REF}$ and the PTAT current $I_{PTAT}$ of FIG. 4 according to a temperature value within a temperature range of about −50° C. to about 150° C.

Referring to FIG. 5B, it may be seen that a current $I_{REF}$-$I_{PTAT}$ flowing through the first resistor R1 decreases in proportion to temperature.

Referring to FIGS. 4 and 5B, as a result of adding the resistivity temperature coefficient cancellation circuit 410 to the bandgap reference circuit 400, a current obtained by canceling the PTAT current $I_{PTAT}$ from the bandgap reference current $I_{REF}$ having a constant value may flow through the first resistor R1. As a result, a CTAT current $I_{CTAT}$ having a property of decreasing in proportion to temperature may flow through the first resistor R1.

FIG. 5C is a simulation result graph showing a value of a bandgap reference voltage $V_{REF}$ generated by the bandgap reference circuit 400 of FIG. 4 according to a temperature value within a temperature range of about −50° C. to about 150° C.

Referring to FIG. 5C, graphs according to various embodiments, which show a bandgap reference current REF according to temperature change, are illustrated by varying the constant γ and the constant ζ (that is, by varying the sizes of the resistors R4 and R1). Accordingly, it may be seen that the value of the bandgap reference current $V_{REF}$ within the temperature range of about −50° C. to about 150° C. is maintained relatively constant.

Therefore, when a bandgap reference circuit according to an embodiment of the inventive concept is used, an oscillator circuit according to an embodiment may output a frequency insensitive to an effect of a temperature coefficient of resistivity, that is, a frequency relatively accurate and constant regardless of temperature, by using a reference voltage source and a reference current source of the bandgap reference circuit.

Figure 6A:
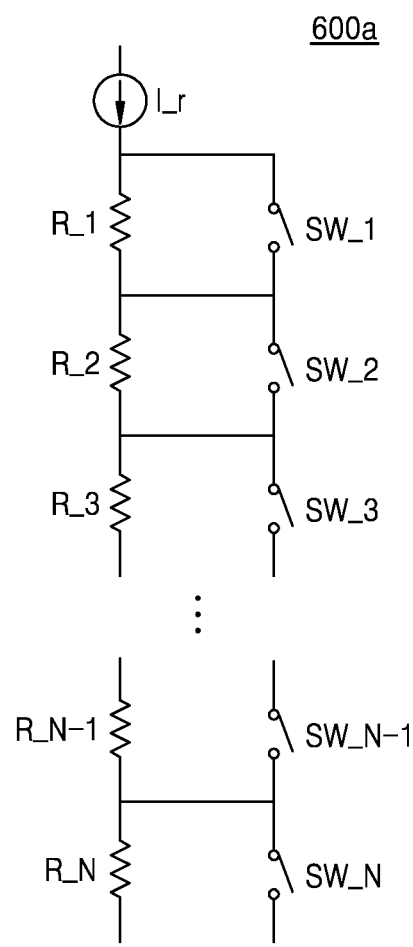
FIG. 6A is a circuit diagram of a resistor trimming circuit according to a comparative example.
Figure 6B:
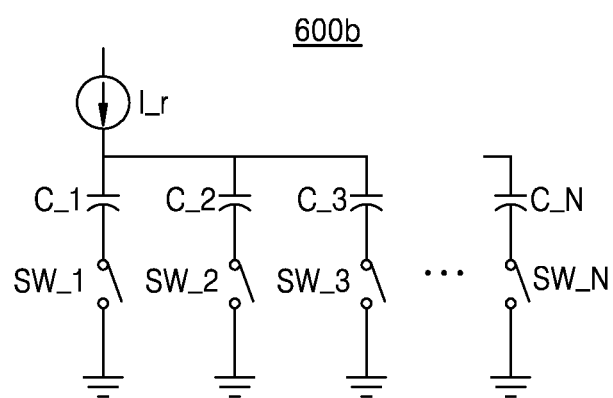
FIG. 6B is a circuit diagram of a capacitor trimming circuit according to a comparative example.

FIG. 6A is a circuit diagram of a resistor trimming circuit 600a according to a comparative example, and FIG. 6B is a circuit diagram of an existing capacitor trimming circuit 600b.

In previous oscillator circuit, in order to correct the absolute values of a resistor and a capacitor, each of which may have different values depending on processes, a method of correcting a frequency (F=1/(R*C)) to a desired target value at room temperature by using a trimming circuit including a trim switch in the resistor or the capacitor is used.

For example, the resistor trimming circuit 600a of FIG. 6A, which includes N resistors R_1 to R_N (where N is a positive integer) connected in series and N switches SW_1 to SW_N (where N is a positive integer) respectively connected to the N resistors R_1 to R_N, may be coupled to an oscillator circuit. The N resistors R_1 to R_N of the resistor trimming circuit 600a may be connected in parallel. A reference current I_r generated by an oscillator circuit may be input to the resistor trimming circuit 600a including the N resistors R_1 to R_N and the N switches SW_1 to SW_N, and an accurate voltage may be applied to a trimming resistor corresponding to a composite resistor formed by turning on/off of the N switches SW_1 to SW_N. A reference voltage generated by an oscillator circuit may be applied to the resistor trimming circuit 600a.

For example, the capacitor trimming circuit 600b of FIG. 6B, which includes N capacitors C_1 to C_N (where N is a positive integer) and N switches SW_1 to SW_N (where N is a positive integer) may be coupled to an oscillator circuit. The N capacitors C_1 to C_N of the capacitor trimming circuit 600b may be connected in parallel. A reference current I_r generated by an oscillator circuit may be input to the capacitor trimming circuit 600b including the N capacitors C_1 to C_N and the N switches SW_1 to SW_N, and an accurate voltage may be applied to a trimming capacitor corresponding to a composite capacitor formed by turning on/off of the N switches SW_1 to SW_N. A reference voltage generated by an oscillator circuit may be applied to the capacitor trimming circuit 600b.

For more precise adjustment, the number of switches may be increased, in which case switch leakage and on-resistance may change with temperature, thereby changing the values of resistors and capacitors. This change also affects the frequency of the oscillator circuit, and thus, it may be difficult for the oscillator circuit to output an accurate and constant frequency.

Figure 7:
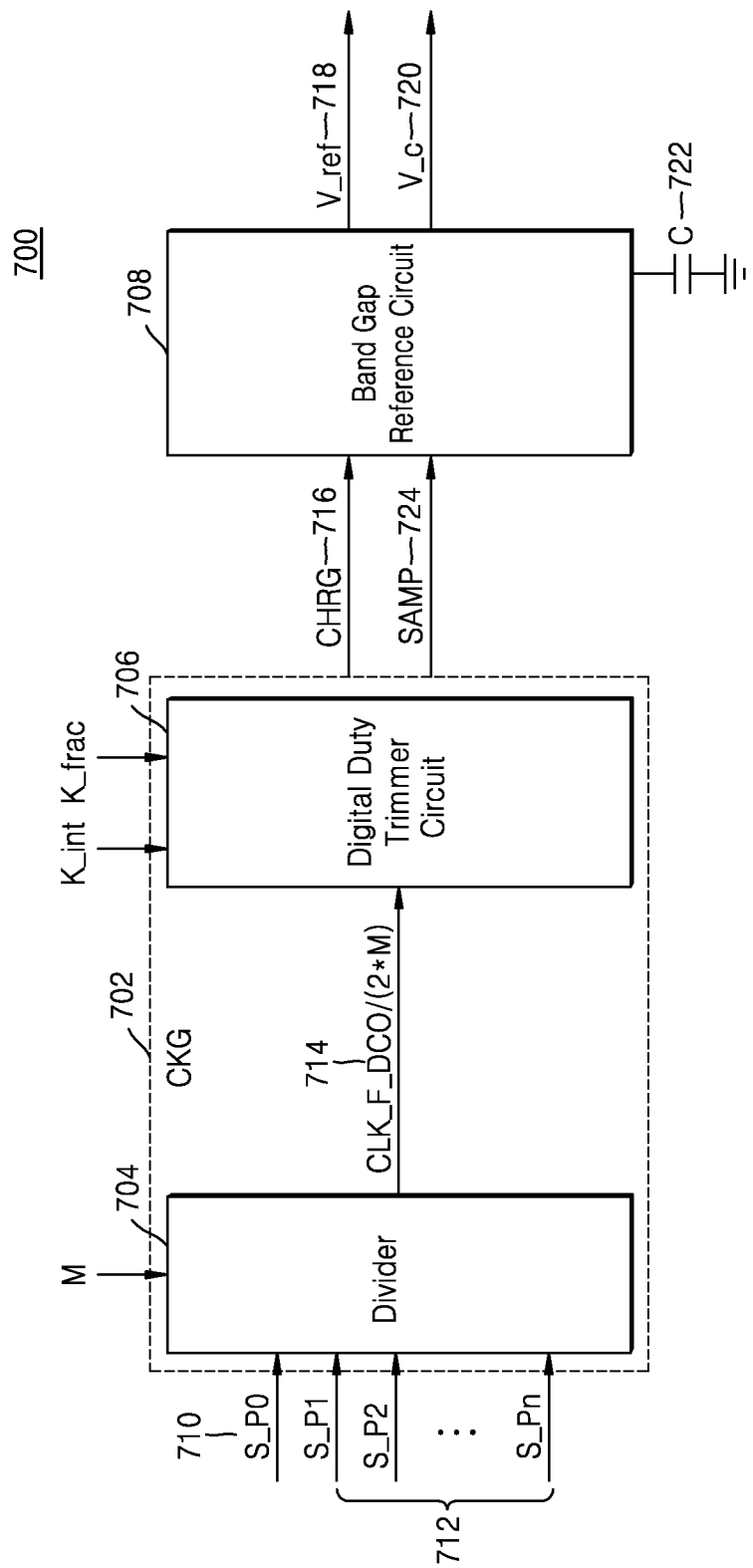
FIG. 7 is a block diagram of a part of a frequency synthesis oscillator circuit including a digital duty trimmer circuit according to an embodiment.

FIG. 7 is a block diagram of a part of a frequency synthesis oscillator circuit 700 including a digital duty trimmer circuit 706 according to an embodiment.

The digital duty trimmer circuit 706 according to an embodiment uses a digital trimming method of adjusting a duty ratio of a charging time of a clock signal CLK_F_DCO/(2*M) (i.e., a signal 714) for charging the capacitor 216 (see FIG. 2), instead of a method of directly trimming the absolute value of a resistor or a capacitor through an existing trimming circuit (i.e., the trimming circuit of FIG. 6A or 6B). The digital duty trimmer circuit 204 may be implemented by the digital duty trimmer circuit 706 of FIG. 7.

Referring to FIG. 7, a clock generator 702 may include a divider 704 and the digital duty trimmer circuit 706. The clock generator 202 of FIG. 2 may be implemented by the clock generator 702 of FIG. 7.

For example, the divider 704 may receive, from a multi-phase DCO (e.g., see 222 in FIG. 2), an oscillation signal S_P0 in phase 0 corresponding to a main phase. The oscillation signal S_P0 in phase 0 corresponds to the oscillation signal S_F_DCO (see FIG. 2) having a frequency F_DCO. Depending on a value of M input by a user, the divider 704 may divide the frequency F_DCO by counting a rising edge M times during a half period of each of oscillation signals S_P0 to S_Pn (i.e., signals 710 and 712) having the frequency F_DCO and counting a falling edge M times during the other half period. Thus, a frequency F_DCO/(2*M) may be obtained. The value of M may input by a control circuit (not shown). Thus, the duty ratio of a generated clock signal becomes 50:50. A clock signal CHRG (i.e., a signal 716) for charging the capacitor 216 with a current I_ref (not shown) generated by a bandgap reference circuit 708 may be generated by adjusting the clock signal CLK_F_DCO/(2*M) (i.e., the signal 714) having a divided frequency F_DCO/(2*M).

According to an embodiment, the digital duty trimmer circuit 706 receives, from the divider 704, the clock signal CLK_F_DCO/(2*M) (i.e., the signal 714) having the divided frequency F_DCO/(2*M) and a 50:50 duty ratio. Depending on a digital trim code K_int and/or a digital trim code K_frac, input by a user, the digital duty trimmer circuit 706 may generate the clock signal CHRG (i.e., the signal 716) for charging a capacitor 722 by adjusting the duty ratio of the clock signal CLK_F_DCO/(2*M) having the divided frequency F_DCO/(2*M). In an embodiment, the digital trim code K_int and/or a digital trim code K_frac are input by a control circuit (not shown).

The digital trim codes K_int and K_frac, which are digital input signals input by a user, are integer values, the digital trim code K_int denotes an integer value in the duty ratio, and the digital trim code K_frac denotes a decimal value in the duty ratio. A detailed description thereof will be given later.

The bandgap reference circuit 708 according to an embodiment receives, from the digital duty trimmer circuit 706, the clock signal CHRG (i.e., the signal 716) for charging the capacitor 722. In addition, the bandgap reference circuit 708 may generate a bandgap reference voltage V_ref and a bandgap reference current I_ref. Depending on the clock signal CHRG for charging the capacitor 722, the bandgap reference current I_ref generated by the bandgap reference circuit 708 may charge the capacitor 722. The bandgap reference circuit 708 may output the bandgap reference voltage V_ref (i.e., a signal 718) and a voltage V_c (i.e., a signal 720) of the capacitor 722 to a comparator (not shown).

Figure 8:
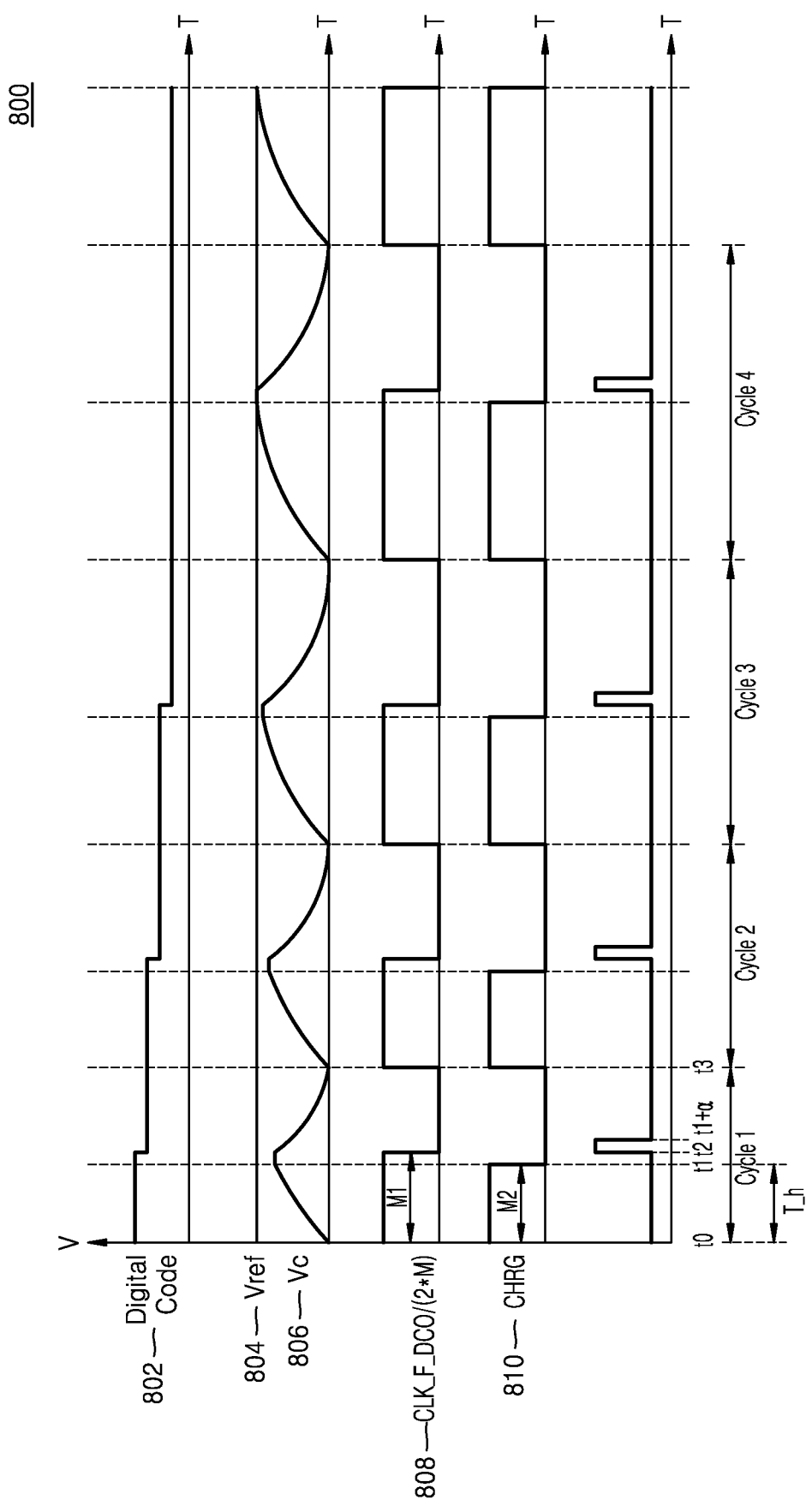
FIG. 8 is a timing diagram illustrating internal signals of the frequency synthesis oscillator circuit of FIG. 7, according to an embodiment.

FIG. 8 is a timing diagram 800 illustrating internal signals of the frequency synthesis oscillator circuit of FIG. 7, according to an embodiment.

Referring to FIGS. 2 and 7, the bandgap reference voltage V_ref (i.e., the signal 718) output from the bandgap reference circuit 708, and the voltage Vc of the capacitor 216 or voltage V_c 722 may be transmitted to the comparator 218, and the comparator 218 may output a sampling result value (0 or 1) by comparing the bandgap reference voltage V_ref with the voltage V_c of the capacitor 722) based on the sampling signal SAMP (i.e., a signal 724) generated by the clock generator 202 or 702. The DLF 220 may generate a digital code based on the sampling result value. The multi-phase DCO 222 may output a multi-phase oscillation signal having a frequency F_DCO to the clock generator 202 according to the digital code received from the DLF 220. The multi-phase oscillation signal may refer to a plurality of oscillation signals having the same output frequency and time-shifted at regular intervals. For example, the multi-phase DCO 222 may output an oscillation signal having a frequency F_DCO of phase 0 to phase 7. The number N_ph of phases may be changed, and embodiments of the inventive concept is not limited thereto. However, throughout the specification, it is assumed that the multi-phase DCO 222 is an 8-phase DCO.

In the timing diagram 800 of FIG. 8, it is assumed that the clock generator 702 generates and outputs a clock signal having a duty ratio of 50:50 and a frequency of F_DCO/(2*M).

Referring to Cycle 1 of FIG. 8, a waveform 802 of a digital code during a half period T_h of Cycle 1 represents the voltage level of an initially set digital code applied to the multi-phase DCO 222. According to an embodiment, the voltage level of the digital code is related to a frequency F_DCO of an oscillation signal output from the multi-phase DCO 222, and when the voltage level of the digital code decreases, the frequency of the oscillation signal output from the multi-phase DCO 222 may decrease.

A waveform 804 of a bandgap reference voltage Vref (or V_ref) signal in Cycle 1 represents the level of a constant bandgap reference voltage generated by the bandgap reference circuit 708.

A waveform 806 of a voltage V_c signal of the capacitor 722 in Cycle 1 represents the voltage V_c of the capacitor 722 charged from the bandgap reference current Iref generated by the bandgap reference circuit 708.

According to the embodiment of FIG. 8, the bandgap reference circuit 708 may include a resistor that having a resistance value varying depending on a process. For example, even when a target resistance value is about 100 ohms, an actual resistance value may be about 99.5 ohms or about 110 ohms depending on a process, voltage and temperature (PVT). According to Equation (9), the bandgap reference current Iref is a function of the second resistor R2 and the third resistor R3, and corresponds to a value that changes depending on the second resistor R2 and the third resistor R3. Therefore, the value of the bandgap reference current Iref is affected by a resistor having a resistance value varying depending on PVT. In addition, the bandgap reference current Iref flows through the capacitor 722 and the voltage V_c of the capacitor 722 is also affected. As a result, the waveform 806 of a voltage V_c signal of the capacitor 722 is different from the waveform 306 of the voltage Vc signal of the capacitor 216 of FIG. 3, and the clock signal CHRG for charging the capacitor 722 adjusting the duty of a clock signal having a frequency F_DCO/(2*M) may be used for correcting a voltage V_c signal of the capacitor 722.

Referring to a waveform 808 of a clock signal CKL_F_DCO/(2*M) having the frequency F_DCO/(2*M) in Cycle 1, a time duration from a first rising edge of the clock signal CLK_F_DCO/(2*M) having the frequency F_DCO/(2*M) to a falling edge following the rising edge corresponds to a half period T_h and may be referred to as M1. In FIG. 8, it is assumed that a user input M is 100. The user input M may have a different value from the duty ratio of the clock signal CLK_F_DCO/(2*M) having the frequency F_DCO/(2*M), but embodiments of the inventive concept are not limited thereto.

Referring to a waveform 810 of a clock signal CHRG for charging the capacitor 722 in Cycle 1, the clock signal CLK_F_DCO/(2*M) having the frequency F_DCO/(2*M) is not used as the clock signal CHRG for charging the capacitor 722, and a signal different from the clock signal CLK_F_DCO/(2*M) may be used as the clock signal CHRG for charging the capacitor 722. The signal may be obtained by adjusting, by the digital duty trimmer circuit 706, the duty ratio of the clock signal CLK_F_DCO/(2*M) having the frequency F_DCO/(2*M). A time duration from a first rising edge of the clock signal CHRG for charging the capacitor 722 to a falling edge following the first rising edge may be referred to as M2.

According to an embodiment, based on a digital trim code K_int, a digital trim code K_frac, and the number N_ph of phases (in the case of multi-phase), M1:M2 may be expressed by Equation (13) below.

$$M_1:M_2:=M:M-(K\_int+K\_frac/N\_ph) \quad (13)$$

According to an embodiment, the capacitor 722 is charged while a rising edge is counted M times during a half period of the oscillation signal having the frequency F_DCO depending on the value of M input by the user. Referring to Equation (13), a portion corresponding to a half period of the clock signal having the frequency F_DCO/(2*M) among the ratio of the half period of the clock signal having the frequency F_DCO/(2*M) and a charging period of the clock signal CHRG for charging the capacitor 722 may be defined as 'M'.

According to an embodiment, a digital trim code K_int, which is a digital input signal input by a user, denotes an integer value in the duty ratio and a digital trim code K_frac denotes a decimal value in the duty ratio. For example, the digital trim code K_int may be an integer value implemented in a main phase among 8 phases, and the digital trim code K_frac may be a decimal value implemented in sub-phases.

Figure 10:
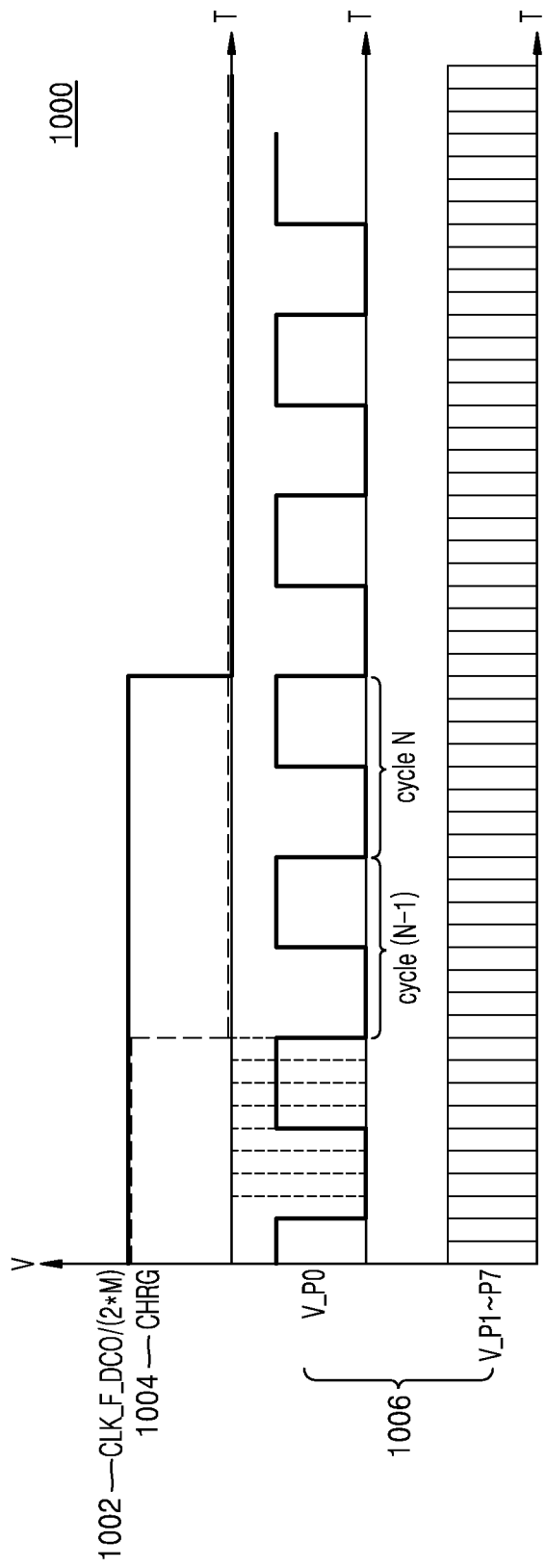
FIG. 10 is a graph showing a result of a digital trimming simulation according to a digital trim code K_int, according to an embodiment.

For example, in the case of an oscillator generating an oscillation signal having a frequency of 1 GHz, an oscillation signal having a frequency of 1 GHz of phase 0 may be output. The oscillation signal having the frequency of 1 GHz of phase 0 may be defined as a main phase. Depending on the digital trim code K_int, a rising edge or a falling edge of the oscillation signal having the frequency of 1 GHz of phase 0 may be counted (M−K_int) times (where it is assumed that the digital trim code K_frac is 0). An example of a waveform of the clock signal CHRG for charging the capacitor 722, which corresponds to this case, is illustrated in FIG. 10.

Figure 11:
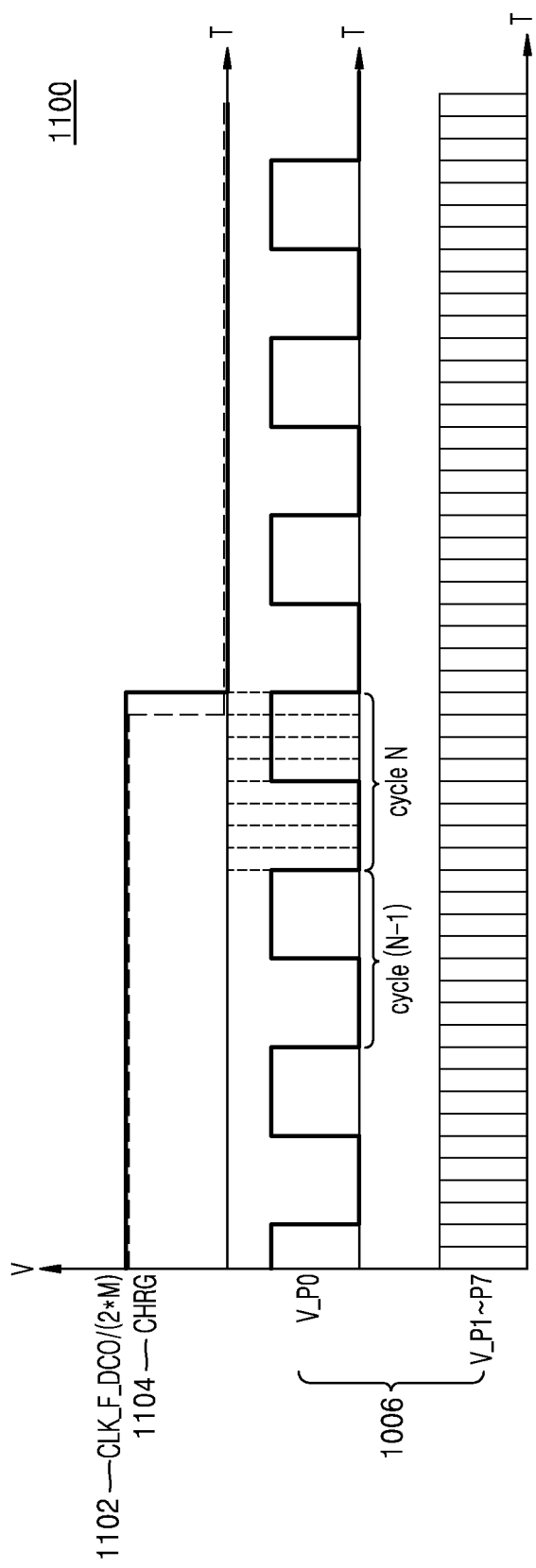
FIG. 11 is a graph showing a result of a digital trimming simulation according to a digital trim code K_frac, according to an embodiment.

Similarly, assuming an oscillator generating an oscillation signal having a frequency of 1 GHz, oscillation signals having a frequency of 1 GHz of phases 1 to 7 may be configured such that there are different rising edges during a time duration (1 ns) from a rising edge to a next rising edge of an oscillation signal having a frequency of 1 GHz of phase 0. That is, the digital trim code K_frac may be implemented by counting edges of sub-phases other than a main phase among multi-phases of a DCO. Depending on the digital trim code K_frac, a rising or falling edge may be effectively counted M−0.125*K_frac times with a trim resolution of 0.125, which is equal to ⅛, by using an oscillation signal having a frequency of 1 GHz of phases 1 to 7 (where it is assumed that K_int is 0). An example of a waveform of the clock signal CHRG for charging the capacitor 722, which corresponds to this case, is illustrated in FIG. 11.

The digital trim code K_frac is for improving trim resolution, that is, is for more precisely trimming the clock signal CHRG for charging the capacitor 722 to obtain a desired target frequency regardless of values of resistors and/or capacitors that change depending on a process.

Referring to Equation (13), depending on the digital trim codes K_int and/or K_frac, a portion corresponding to a charging period of the clock signal CHRG for charging the capacitor 722 among a half period of the clock signal having the frequency F_DCO/(2*M) and the charging period of the clock signal CHRG for charging the capacitor 722 may be defined as 'M−(K_int+0.125*K_frac)'.

According to a digital trimming method as described above, the duty ratio of the clock signal CHRG for charging the capacitor 722 may be adjusted. For example, when M=100, K_int=9, and K_frac=8, M−(K_int+0.125* K_frac)=90, and thus the duty ratio of the clock signal CHRG for charging the capacitor 722 may be 45:55.

Referring to the waveform 806 of the voltage V_c signal of the capacitor 722 in Cycle 1, the capacitor 722 may be charged during a time duration from T=t0 to T=t1, and thus, the voltage V_c of the capacitor 722 may increase. During the other half period of Cycle 1, that is, during a time duration from T=t1 to T=t3, a logic circuit may operate. The logic circuit may be defined as a circuit that uses, as a clock signal, a final oscillation signal output from the frequency synthesis oscillator circuit 200 according to an embodiment or operates in synchronization with a clock signal generated from the final oscillation signal.

According to an embodiment, at time T=t1, the voltage Vc of the capacitor 216 (or V_c of capacitor 716) may have a smaller value than the bandgap reference voltage Vref (or V_ref). At time T=t1, as the clock signal CHRG for charging the capacitor 216 (or 722) is at a falling edge, no current may flow and the charging of the capacitor 216 (or 722) may be held. A digital code may be updated by a digital loop filter at a falling edge of the sampling signal SAMP. At T=t2+a, the capacitor 216 (or 722) may be discharged using the second switch 234 during a time duration from T=t2+a to T=t3 according to a reset signal RST (not shown).

Referring to the waveform 810 of the sampling signal SAMP, sampling may be performed at a rising edge of the sampling signal SAMP to compare the bandgap reference voltage V_ref with the voltage V_c of the capacitor 722 at a certain time T=t2 after the charging of the capacitor 722 is held in Cycle 1, and accordingly, the comparator 218 may output a sampling result value (0 or 1). For example, the digital code 302 may be updated by DLF 220 at a falling edge of the sampling signal SAMP. The sampling signal SAMP (i.e., the signal 310) of FIG. 3 is merely an example, and embodiments of the inventive concept are not limited thereto.

The above-described processes may be repeated until the band gap reference voltage V_ref and the voltage V_c of the capacitor 722 have the same value. According to an embodiment, the above-described processes may be repeated in Cycle 2, Cycle 3, and Cycle 4. If it is determined that the bandgap reference voltage V_ref is equal to the voltage V_c of the capacitor 722, as a sampling result of Cycle 3, the frequency of an output oscillation signal of the multi-phase DCO 222 may be locked to the final output frequency that is the target output frequency.

Figure 9:
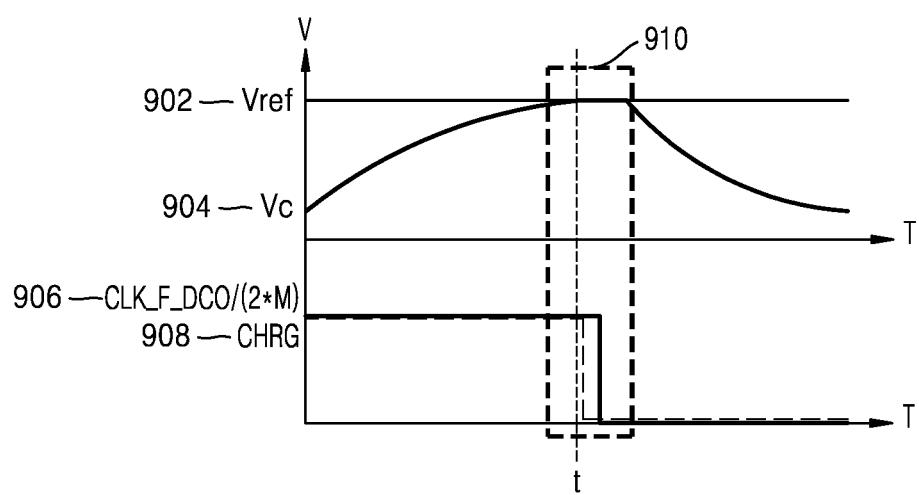
FIG. 9 illustrates a portion of the timing diagram of FIG. 8 illustrating internal signals of the frequency synthesis oscillator circuit, according to an embodiment.

FIG. 9 illustrates a portion of the timing diagram of FIG. 8 illustrating internal signals of the frequency synthesis oscillator circuit, according to an embodiment.

Referring to FIGS. 8 and 9, FIG. 9 shows, on an enlarged scale, the bandgap reference voltage Vref (i.e., a waveform 902), the voltage Vc (i.e., a waveform 904) of the capacitor 216 or voltage V_c of capacitor 722, the clock signal CLK_F_DCO/(2*M) (i.e., a waveform 906) having the frequency F_DCO/(2*M), and the clock signal CHRG (i.e., a waveform 908) for charging the capacitor 216 or 722, the clock signal CHRG having an adjusted duty ratio.

Referring to the waveform 902 of the bandgap reference voltage Vref (or V_ref) and the waveform 904 of the voltage Vc of the capacitor (e.g., 216 or 722), the capacitor (e.g., 216 or 722) may be charged by the bandgap reference current Iref, depending on the clock signal CHRG having an adjusted duty ratio. According to an embodiment, the capacitor (e.g., 216 or 722) may be sufficiently charged at T=t and thus the voltage Vc (or V_c) of the capacitor (e.g., 216 or 722) may have the same value as the bandgap reference voltage Vref (or V_ref), and the frequency of the clock signal CHRG, of which duty ratio is adjusted at T=t, may be the final output frequency.

According to an embodiment, a final output frequency Fout, that is, a target frequency, of a, 8-phase DCO may be expressed by Equation (14).

$$F_{out} = \frac{\{M - (K_{int} + 0.125 \times K_{frac})\} \times I_{ref}}{C \times V_{ref}} \quad (14)$$

According to an embodiment, a digital trim code K_int and/or a digital trim code K_frac may be input according to a frequency desired by the user, that is, according to a user input M.

For example, assuming that a user input M is 200 and a digital trim code K_int for a target frequency of 1 GHz of a multi-phase DCO is 2, when the user wants to set the target frequency of the multi-phase DCO to 500 MHz, the user input M is set to 100, and in proportion to the user input M, the digital trim code K_int of 1 may be input.

FIG. 10 is a graph 1000 showing a result of a digital trimming simulation according to a digital trim code K_int, according to an embodiment.

For example, FIG. 10 may be an enlarged view of a portion 910 of the timing diagram of FIG. 9, and the graph 1000 of FIG. 10 shows a result obtained by performing a simulation assuming that the digital trim code K_int is 2 and the digital trim code K_frac is 0.

The graph 1000 of FIG. 10, which illustrate internal signals of a frequency synthesis oscillator circuit, shows a waveform 1002 of a clock signal having a frequency of F_DCO/(2*M) and a waveform 1004 of a clock signal CHRG for charging the capacitor (e.g., 216 or 722), and also shows a waveform V_P0 of an oscillation signal S_P0 corresponding to phase 0, i.e., a main phase and waveforms V_P1 to V_P7 of oscillation signals S_P1 to S_P7 corresponding to phases 1 to 7.

For example, a time duration from a first rising edge of the clock signal having the frequency of F_DCO/(2*M) to a falling edge following the first rising edge may be defined as T_h1, and a time duration from a first rising edge of the clock signal CHRG for charging the capacitor (e.g., 216 or 722) to a falling edge following the first rising edge of the clock signal CHRG may be defined as T_h2.

As described above, the time duration T_h1 of the clock signal having the frequency of F_DCO/(2*M) may be calculated by Equation (T_h1=(C*Vref)/Iref), and the time duration T_h2 of the clock signal CHRG for charging the capacitor (e.g., 216 or 722) may be calculated by Equation (T_h2=(M)*C*Vref)/{(M−2)*Iref}). Accordingly, T_h1: T_h2, which is the ratio of the time duration T_h1 of the clock signal having the frequency of F_DCO/(2*M) to the time duration T_h2 of the clock signal CHRG for charging the capacitor (e.g., 216 or 722), may correspond to M:M-2, and the final output frequency may be output as Fout={(M−2)*Iref}/(C*Vref).

According to the waveform V_P0 of the oscillation signal S_P0 corresponding to phase 0, assuming that the user input M is 100, a rising edge of the oscillation signal S_P0 corresponding to phase 0 may be counted 100 times during a half period (i.e., the time duration T_h1) of the clock signal having the frequency F_DCO/(2*M). For example, cycle (N−1) and cycle N in FIG. 10 may be cycle 99 and cycle 100, respectively. Descriptions given above with reference to FIG. 10 may also be applied to the embodiment of FIG. 11, which will be described later.

According to an embodiment, the fact that the digital trim code K_int=2 is input may mean that a rising edge is counted 100 times during the half period (i.e., the time duration T_h1) of the clock signal having the frequency F_DCO/(2*M) and that a rising edge is counted 98 times during the time duration T_h2 of the clock signal CHRG for charging the capacitor 722.

Accordingly, referring to FIG. 10, it may be seen that a time duration T_h1-T_h2 from the falling edge of the clock signal having the frequency F_DCO/(2*M) to the falling edge of the clock signal CHRG for charging the capacitor (e.g., 216 or 722) corresponds to a time duration in which a cycle of the oscillation signal S_P0 corresponding to phase 0 is repeated two times.

FIG. 11 is a graph 1100 showing a result of a digital trimming simulation according to a digital trim code K_frac, according to an embodiment.

For example, FIG. 11 may be an enlarged view of a portion 910 of the timing diagram of FIG. 9, and the graph 1100 of FIG. 11 shows a result obtained by performing a simulation assuming that the digital trim code K_int is 0 and the digital trim code K_frac is 1.

The graph 1100 of FIG. 11, which illustrate internal signals of a frequency synthesis oscillator circuit, shows a waveform 1102 of a clock signal having a frequency of F_DCO/(2*M) and a waveform 1104 of a clock signal CHRG for charging the capacitor (e.g., 216 or 722), and also shows a waveform V_P0 of an oscillation signal S_P0 corresponding to phase 0, i.e., a main phase and waveforms V_P1 to V_P7 of oscillation signals S_P1 to S_P7 corresponding to phases 1 to 7.

For example, a time duration from a first rising edge of the clock signal having the frequency of F_DCO/(2*M) to a falling edge following the first rising edge may be defined as T_h1, and a time duration from a first rising edge of the clock signal CHRG for charging the capacitor (e.g., 216 or 722) to a falling edge following the first rising edge of the clock signal CHRG may be defined as T_h2.

As described above, the time duration T_h1 of the clock signal having the frequency of F_DCO/(2*M) may be calculated by Equation (T_h1=(C*Vref)/Iref), and the time duration T_h2 of the clock signal CHRG for charging the capacitor (e.g., 216 or 722) may be calculated by Equation (T_h2={(M−0.125)*C*Vref}/(M*Iref)). Accordingly, T_h1:T_h2, which is the ratio of the period of the clock signal having the frequency of F_DCO/(2*M) to the period of the clock signal CHRG for charging the capacitor (e.g., 216 or 722), may correspond to M:M−0.125, and the final output frequency may be output as Fout={(M−0.125)*Iref}/(C*Vref).

According to the waveform V_P0 of the oscillation signal S_P0 corresponding to phase 0, assuming that the user input M is 100, a rising edge of the oscillation signal S_P0 corresponding to phase 0 may be counted 100 times during a half period (i.e., the time duration T_h1) of the clock signal having the frequency F_DCO/(2*M). For example, cycle (N−1) and cycle N in FIG. 11 may be cycle 99 and cycle 100, respectively.

According to an embodiment, the fact that the digital trim code K_int=1 is input may mean that a rising edge is counted 100 times during the half period (i.e., the time duration T_h1) of the clock signal having the frequency F_DCO/(2*M) and that a rising edge is effectively counted 99.875 times during the time duration T_h2 of the clock signal CHRG for charging the capacitor (e.g., 216 or 722).

Accordingly, referring to FIG. 11, it may be seen that a time duration T_h1-T_h2 from the falling edge of the clock signal having the frequency F_DCO/(2*M) to the falling edge of the clock signal CHRG for charging the capacitor (e.g., 216 or 722) corresponds to a time duration in which a cycle of the oscillation signal S_P0 corresponding to phase 0 is repeated ⅛ times.

Figure 12:
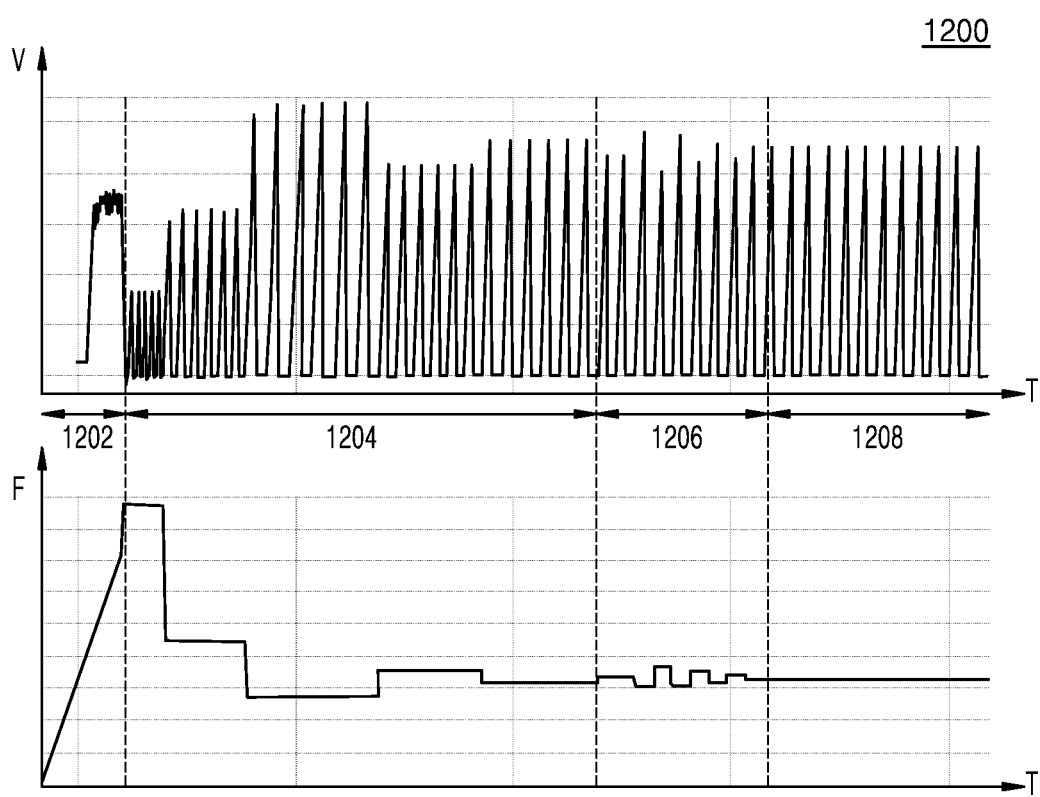
FIG. 12 is a graph showing simulation results showing a process in which an output frequency is fixed.

FIG. 12 is a graph showing simulation results showing a process in which an output frequency is fixed.

Referring to the first graph of FIG. 12, a bandgap reference circuit according to an embodiment may be driven by receiving start-up power from a start-up circuit (operation 1202). The start-up circuit may be included in the bandgap reference circuit, or may be located outside the bandgap reference circuit.

In addition, a process of adjusting an oscillation frequency of a DCO to be close to a target frequency by an automatic frequency calibrator (AFC) may be performed (operation 1204). For example, the AFC may output a digital code corresponding to a difference between a reference frequency and a feedback frequency to a multi-phase DCO based on a binary search method. Referring to operation 1206 of a first graph of FIG. 12, as time elapses, a frequency bandwidth is controlled and the voltage of a first capacitor converges to a reference voltage. When the voltage of the first capacitor is equal to the reference voltage, the digital code is no longer changed and the voltage of the first capacitor may be locked.

A second graph of FIG. 12 is a simulation result graph showing the first graph of FIG. 12 in a time-frequency domain. It may be confirmed that an oscillator circuit according to an embodiment outputs an oscillation signal having a constant frequency, that is, a final output frequency by converging the frequency of the oscillation signal to a target frequency as time elapses.

Figure 13:
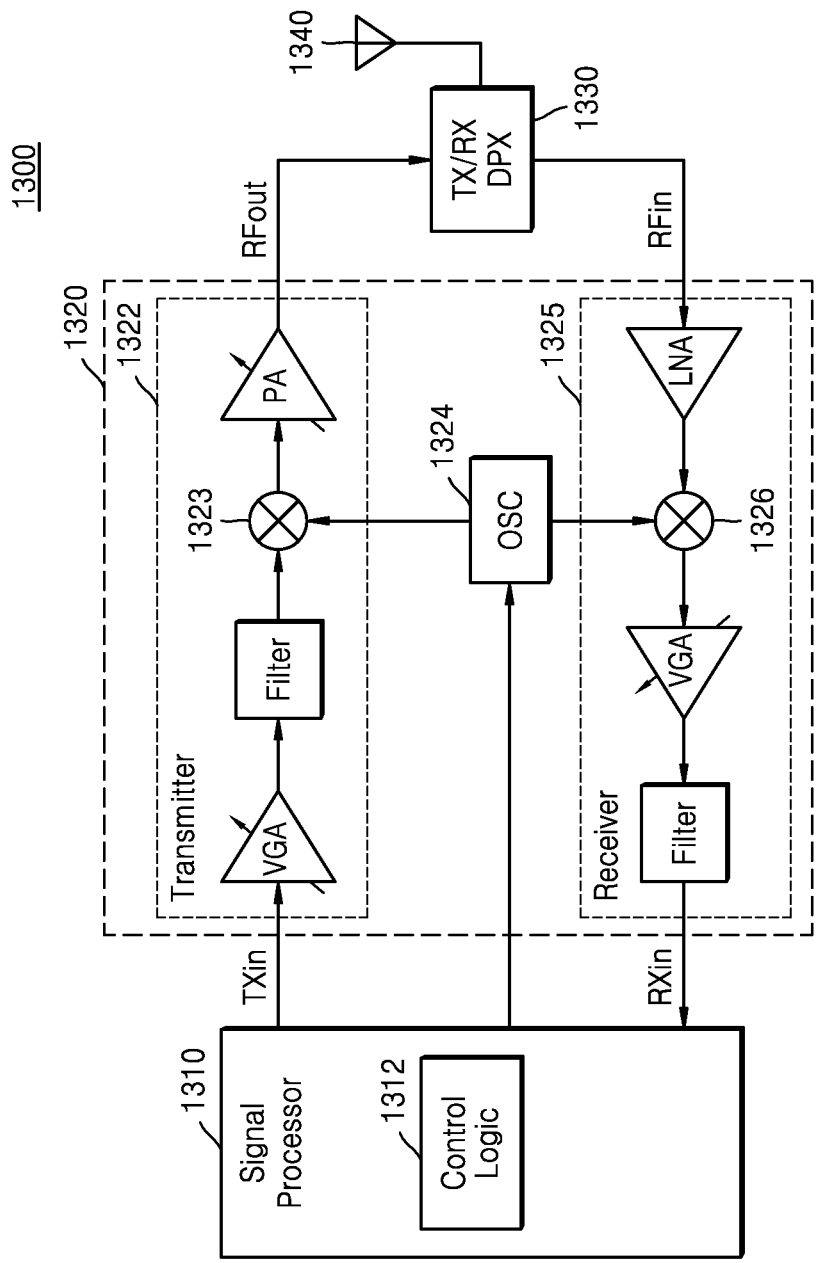
FIG. 13 is a block diagram of a wireless communication device including a frequency synthesis oscillator circuit according to an example embodiment.

FIG. 13 is a block diagram of a wireless communication device 1300 including a frequency synthesis oscillator circuit according to an example embodiment.

The wireless communication device 1300 includes an antenna 1340, and may communicate with a counterpart device by transmitting or receiving signals through the antenna 1340. A wireless communication system in which the wireless communication device 1300 communicates with a counterpart device may be a wireless communication system using a cellular network, such as a 5th generation wireless (5G) system, a long term evolution (LTE) system, an LTE-advanced system, a code division multiple access (CDMA) system, or a global system for mobile communications (GSM) system, a wireless local area network (WLAN) system, or any other wireless communication system.

According to an embodiment, the wireless communication device 1300 includes a signal processor 1310, a transceiver 1320, and a transmission/reception duplexer 1330. The transmission/reception duplexer 1330 may provide a signal received through the antenna 1340 to the transceiver 1320 as a radio frequency (RF) input signal RFin, and may provide an RF output signal RFout received from the transceiver 1320 to the antenna 1340.

Depending on implementation, the signal processor 1310 may be a baseband processor and may include control logic 1312 (e.g., a logic circuit). The signal processor 1310 may process a baseband transmit/receive signal. Specifically, the signal processor 1310 may generate a baseband signal for a transmit signal path of the transceiver 1320 and process a baseband signal received through a receive signal path of the transceiver 1320.

In an embodiment, the transceiver 1320 includes a transmitter 1322, a receiver 1325, and a frequency synthesis oscillator circuit 1324. The frequency synthesis oscillator circuit shown in FIG. 2 is an example of the frequency synthesis oscillator circuit 1324.

The transmitter 1322 may generate the RF output signal RFout by processing a transmit input signal TXin received from the signal processor 1310. As shown in FIG. 13, the transmitter 1322 may include a variable gain amplifier (VGA), a TX filter, a TX mixer 1323, and a power amplifier (PA) to process the transmit input signal TXin. The receiver 1325 may generate the receive input signal RXin by processing the RF input signal RFin and provide the receive input signal RXin to the signal processor 1310. The receiver 1325 may include a low noise amplifier (LNA), an RX mixer 1326, a variable gain amplifier (VGA), and an RX filter to process the RF input signal RFin. The frequency synthesis oscillator circuit 1324 according to an embodiment may generate a reference clock signal having a frequency for sampling the transmit input signal TXin and the RF input signal RFin and provide the reference clock signal to the TX mixer 1323 and the RX mixer 1326. The frequency synthesis oscillator circuit 1324 may include the clock generator according to the above-described embodiments. Although an example in which control information is provided from the signal processor 1310 is illustrated in FIG. 12, embodiments of the inventive concept are not limited thereto. As an example, the control information may be generated inside the transceiver 1320, or may be generated from other control circuitry outside the transceiver 1320.

Figure 14:
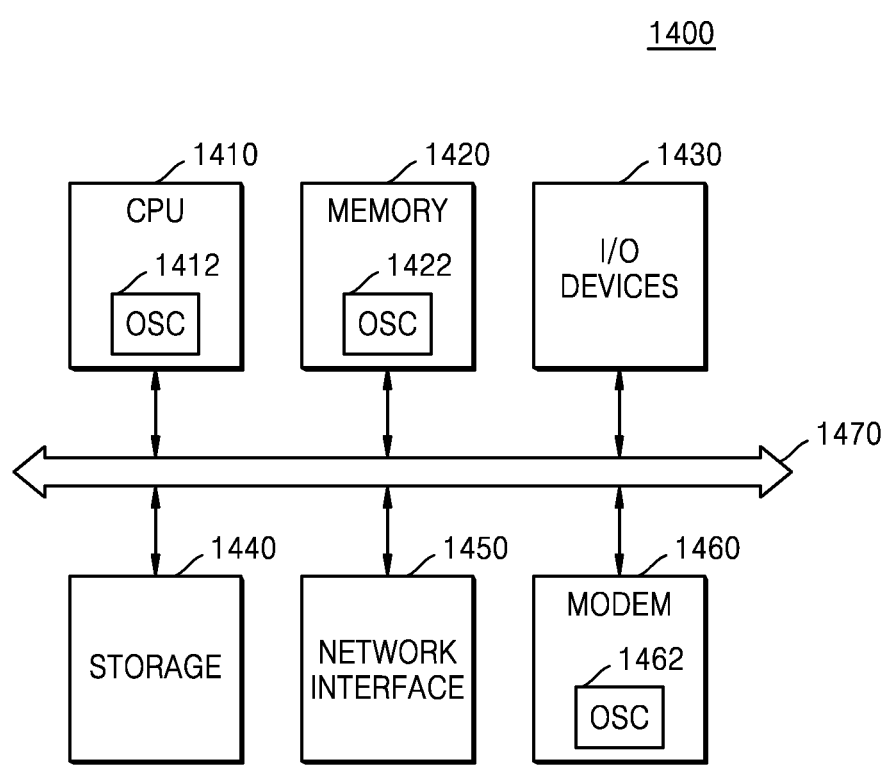
FIG. 14 is a block diagram of a computing system including a frequency synthesis oscillator circuit according to an example embodiment.

FIG. 14 is a block diagram of a computing system 140 including a frequency synthesis oscillator circuit according to an example embodiment.

The computing system 1400 may be a stationary computing system, such as a desktop computer, a workstation, or a server, or a portable computing system, such as a laptop computer. Also, the computing system 1400 may be a semiconductor device embodied with a semiconductor. As shown in FIG. 14, the computing system 1400 may include a processor 1410 including an oscillator 1412, a memory 1420, input/output devices 1430, a storage device 1440, a network interface 1450, and a modem 1460. The processor 1410, the memory 1420, the input/output devices 1430, the storage device 1440, the network interface 1450, and the modem 1460 may be connected to a bus 1470, and may communicate with one another through the bus 1470.

The processor 1410 may be referred to as a processing unit. For example, the processor 1410 may include at least one core capable of executing an instruction set (e.g., Intel Architecture-32 (IA-32), 64-bit extension IA-32, x86-64, PowerPC, Sparc, MIPS, ARM, IA-64, etc.), such as a micro-processor, an application processor (AP), a digital signal processor (DSP), or a graphic processing unit (GPU). For example, the processor 1410 may access the memory 1420 via the bus 1470 and execute instructions stored in RAM or ROM.

In addition, the processor 1410 may include the oscillator 1412. The oscillator 1412 may include a frequency synthesis oscillator circuit according to embodiments of the disclosure to perform frequency synthesis and multiplication and clock signal generation. For example, the oscillator 1412 may generate a clock signal for operating the processor 1410 requiring a clock signal, and may change or multiply the frequency of the clock signal according to circumstances.

The memory 1420 may include a volatile memory (i.e., random access memory (RAM)) such as dynamic random access memory (DRAM), or a non-volatile memory (i.e., read only memory (ROM)) such as flash memory.

Also, the memory 1420 may include an oscillator 1422. The oscillator 1422 may include a frequency synthesis oscillator circuit according to embodiments of the disclosure to perform frequency synthesis and multiplication and clock signal generation. For example, the oscillator 1422 may generate a clock signal for operating the processor 1410 requiring a clock signal, and may change or multiply the frequency of the clock signal according to circumstances.

The input/output devices 1430 may include an input device such as a keyboard or a pointing device, and may include an output device such as a display device or a printer. For example, a user may input a value of M and a digital trim code K_int or K_frac through the input/output devices 1430, and the input/output devices 1430 may transmit, through the bus 1470, the value of M and the digital trim code K_int or K_frac to the oscillator 1412 in the processor 1410 and the oscillator 1422 in the memory 1420. The oscillator 1412 in the processor 1410 and the oscillator 1422 in the memory 1420 may adjust the frequency of the clock signal according to the value of M and the digital trim code K_int or K_frac.

The storage device 1440 may store data to be processed by the processor 1410 or data processed by the processor 1410. That is, the processor 1410 may generate data by processing data stored in the storage device 1440, and may store the generated data in the storage device 1440.

The network interface 1450 may provide access to a network external to the computing system 1400. For example, the network may include a number of computing systems and communication links, and the communication links may include wired links, optical links, wireless links, or any other type of links.

The modem 1460 may perform wireless communication or wired communication with an external device. For example, the modem 1460 may perform Ethernet communication, near field communication (NFC), radio frequency identification (RFID) communication, mobile telecommunication, memory card communication, universal serial bus (USB) communication, and/or the like, but is not limited thereto.

The modem 1460 may also include an oscillator 1462. The oscillator 1462 may include a frequency synthesis oscillator circuit according to embodiments of the disclosure to perform frequency synthesis and multiplication and clock signal generation. For example, the oscillator 1462 may generate a clock signal for operating the modem 1460 requiring a clock signal, and may change or multiply the frequency of the clock signal according to circumstances.

Depending on implementation, the oscillators 1412, 1422, and 1462 may be configured as externally independent devices, and may each further include a clock control unit configured to control frequencies of a clock signal of the computing system 1400. Accordingly, different clock signals may be provided to the processor 1410, the memory 1420, and the modem 1460, which operate at different operating frequencies.

While the inventive concept has been particularly shown and described with reference to embodiments thereof, it will be understood that various changes in form and details may be made therein without departing from the spirit and scope of the following claims.

What is claimed is:

1. A bandgap reference circuit comprising:
   a reference current generation circuit configured to output a bandgap reference current insensitive to a temperature change, by using a first voltage inversely proportional to temperature and a third voltage proportional to temperature, wherein the third voltage is a difference between the first voltage and a second voltage;
   a resistivity temperature coefficient cancellation circuit configured to remove a first current proportional to temperature from the bandgap reference current by using the third voltage; and
   a reference voltage generation circuit configured to output a bandgap reference voltage insensitive to a temperature change, by using a second current inversely proportional to temperature and a first resistor proportional to temperature, the second current being generated by removing the first current from the bandgap reference current.

2. The bandgap reference circuit of claim 1, wherein the resistivity temperature coefficient cancellation circuit includes a second resistor having both ends to which the first and second voltages are respectively applied from the reference current generation circuit, the second resistor being proportional to a temperature and having one end connected to a first node of the reference voltage generation circuit to which the bandgap reference current is applied, wherein the first current due to the third voltage flows through the second resistor.

3. The bandgap reference circuit of claim 2, wherein the reference current generation circuit includes a first bipolar junction transistor (BJT) generating the first voltage, a second BJT generating the second voltage, and a first operational amplifier.

4. The bandgap reference circuit of claim 2, wherein the reference current generation circuit includes a third resistor to which the third voltage is applied, the first current flowing through the second resistor in the resistivity temperature coefficient cancellation circuit having Proportional To Absolute Temperature (PTAT) characteristics identical to those of a current flowing through the third resistor.

5. The bandgap reference circuit of claim 3, wherein the resistivity temperature coefficient cancellation circuit further includes a first transistor and a second operational amplifier, wherein an input terminal of the second operational amplifier is connected to the third node of the reference current generation circuit and an end of the second resistor to apply an output voltage to a gate terminal of the first transistor, and the first transistor is connected between the end of the second resistor and a ground node.

6. The bandgap reference circuit of claim 4, wherein the reference current generation circuit includes a fourth resistor to which the first voltage is applied, wherein a current flowing through the fourth resistor has Complementary To Absolute Temperature (CTAT) characteristics that are identical to those of the second current flowing through the first resistor in the reference voltage generation circuit.

7. The bandgap reference circuit of claim 2, wherein the second current is a current flowing through the first resistor, and the bandgap reference voltage is a voltage applied to the first resistor, wherein the bandgap reference voltage is determined by the first resistor and the second resistor.

8. A bandgap reference circuit comprising:
a reference current generator including first and second bipolar junction transistors (BJTs) and first and second operational amplifiers, the reference current generator being configured to generate a reference current insensitive to a temperature change by using a difference between a base-emitter voltage of the first BJT and a base-emitter voltage of the second BJT;
a resistivity temperature coefficient cancellation circuit including a first Proportional To Absolute Temperature (PTAT) resistor and a third operational amplifier, the resistivity temperature coefficient cancellation circuit being configured to remove a PTAT current from the reference current; and
a reference voltage generator including a second PTAT resistor through which a Complementary To Absolute Temperature (CTAT) current generated by removing the PTAT current from the reference current flows, the reference voltage generator being configured to output a voltage of the second PTAT resistor as a reference voltage,
wherein the base-emitter voltages of the first and second BJTs are respectively applied to both ends of the first PTAT resistor by using the second and third operational amplifiers, and the PTAT current flows through the first PTAT resistor.

9. The bandgap reference circuit of claim 8, wherein, with respect to the first PTAT resistor, the base-emitter voltages of the first and second BJTs from the reference current generator are respectively applied to both ends of the first PTAT resistor, one end of the first PTAT resistor is connected to a first node of the reference voltage generator to which the reference current is applied, and the PTAT current flows through the first PTAT resistor due to the difference between the base-emitter voltage of the first BJT and the base-emitter voltage of the second BJT.

10. The bandgap reference circuit of claim 9, wherein, with respect to the first PTAT resistor, a second node of the reference current generator to which the base-emitter voltage of the first BJT is applied and a third node of the reference current generator to which the base-emitter voltage of the second BJT is applied are respectively connected to both ends of the first PTAT resistor.

11. The bandgap reference circuit of claim 8, wherein the reference current generator comprises:
a third PTAT resistor to which the difference between the base-emitter voltage of the first BJT and the base-emitter voltage of the second BJT is applied; and
a fourth PTAT resistor to which the base-emitter voltage of the first BJT is applied, wherein the reference current is determined by the third PTAT resistor and the fourth PTAT resistor.

12. The bandgap reference circuit of claim 8, wherein the resistivity temperature coefficient cancellation circuit further comprises a first transistor, wherein an input terminal of the third operational amplifier is connected to a node of the reference current generator and an end of the first PTAT resistor to apply an output voltage to a gate terminal of the first transistor, and the first transistor is connected between the end of the first PTAT resistor and a ground node.

13. The bandgap reference circuit of claim 11, wherein the PTAT current flowing through the first PTAT resistor in the resistivity temperature coefficient cancellation circuit has PTAT characteristics identical to those of a current flowing through the third PTAT resistor.

14. The bandgap reference circuit of claim 11, wherein the CTAT current flowing through the second PTAT resistor in the reference voltage generator has CTAT characteristics identical to those of a current flowing through the fourth PTAT resistor.

15. The bandgap reference circuit of claim 8, wherein the CTAT current is a current flowing through the second PTAT resistor, and the reference voltage is a voltage applied to the second PTAT resistor, wherein the reference voltage is determined by the first PTAT resistor and the second PTAT resistor.

* * * * *